(12) United States Patent
Matsuzaki

(10) Patent No.: US 7,663,447 B2
(45) Date of Patent: Feb. 16, 2010

(54) OSCILLATOR CIRCUIT HAVING A STABLE OUTPUT SIGNAL RESISTANT TO POWER SUPPLY VOLTAGE FLUCTUATION

(75) Inventor: Takanori Matsuzaki, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 11/875,088

(22) Filed: Oct. 19, 2007

(65) Prior Publication Data

US 2008/0258822 A1 Oct. 23, 2008

(30) Foreign Application Priority Data

Oct. 31, 2006 (JP) .............................. 2006-295314

(51) Int. Cl.
- H03B 5/24 (2006.01)
- H03K 3/03 (2006.01)
- H03L 1/00 (2006.01)
- H04B 1/40 (2006.01)

(52) U.S. Cl. .................. 331/186; 331/57; 331/185; 455/75

(58) Field of Classification Search ............ 331/57, 331/175, 176, 177 R, 185, 186; 455/75, 455/76

See application file for complete search history.

(56) References Cited

U.S. PATENT DOCUMENTS

| | | | |
|---|---|---|---|
| 4,968,952 A | 11/1990 | Kehler, Jr. | |
| 5,133,064 A | 7/1992 | Hotta et al. | |
| 5,359,727 A | 10/1994 | Kurita et al. | |
| 5,440,277 A * | 8/1995 | Ewen et al. | 331/176 |
| 5,594,391 A | 1/1997 | Yoshizawa | |
| 5,703,541 A * | 12/1997 | Nakashima | 331/57 |
| 5,956,378 A | 9/1999 | Soda | |
| 6,396,357 B1 * | 5/2002 | Sun et al. | 331/57 |

(Continued)

FOREIGN PATENT DOCUMENTS

JP 2001-024485 1/2001

(Continued)

OTHER PUBLICATIONS

European Search Report (Application No. 07020170.2) dated Dec. 27, 2007.

(Continued)

Primary Examiner—David Mis
(74) Attorney, Agent, or Firm—Fish & Richardson P.C.

(57) ABSTRACT

A stable frequency is outputted by an oscillator circuit including a constant current circuit which is electrically connected between a first terminal and a second terminal, a voltage controlled oscillator circuit in which an oscillation frequency fluctuates in accordance with a potential difference between power supply voltage terminals, an n-channel transistor, a p-channel transistor in which a gate-source voltage is set to be constant by the constant current circuit, and a capacitor, in which a source electrode of the p-channel transistor is electrically connected to the first terminal, a drain electrode of the p-channel transistor is electrically connected a drain electrode and a gate electrode of the n-channel transistor, a source electrode of the n-channel transistor is electrically connected to the second terminal, and a gate electrode of the n-channel transistor is electrically connected to the second terminal through the capacitor.

20 Claims, 17 Drawing Sheets

U.S. PATENT DOCUMENTS

| | | |
|---|---|---|
| 6,563,387 B2 | 5/2003 | Hirano et al. |
| 6,809,603 B1 * | 10/2004 | Ho ............................... 331/57 |
| 6,894,574 B2 | 5/2005 | Nagatomo |
| 7,023,283 B2 | 4/2006 | Kawasumi et al. |
| 7,218,170 B1 * | 5/2007 | Carter et al. ................ 327/552 |
| 2003/0076180 A1 | 4/2003 | Murakami |
| 2003/0090330 A1 | 5/2003 | Sakurai et al. |
| 2005/0088247 A1 | 4/2005 | Yasui |
| 2006/0197610 A1 | 9/2006 | Hirata et al. |

FOREIGN PATENT DOCUMENTS

| | | |
|---|---|---|
| JP | 2001-251186 | 9/2001 |
| JP | 2003-283307 | 10/2003 |
| JP | 2005-130092 | 5/2005 |
| WO | WO 2007/018105 A1 | 2/2007 |

OTHER PUBLICATIONS

R. Jacob Baker et al.; "CMOS Circuit Design, Layout, and Simulation"; *IEEE Press Series on Microelectronic Systems*; pp. 384-387 ("19.2.1 The Current-Starved VCO") and 469-470 ("21.2 Current Source-Self-Biasing"); 1998.

* cited by examiner

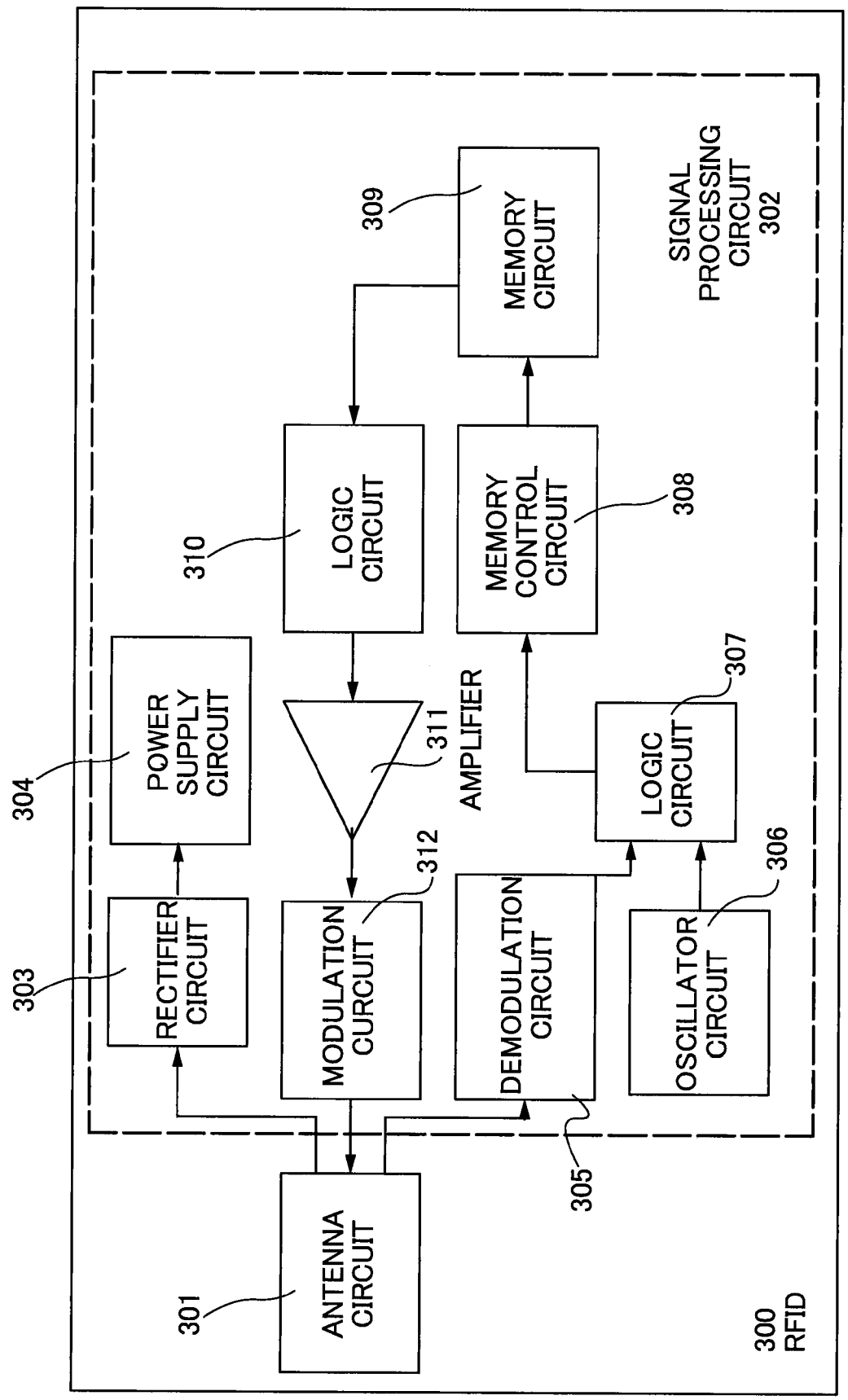

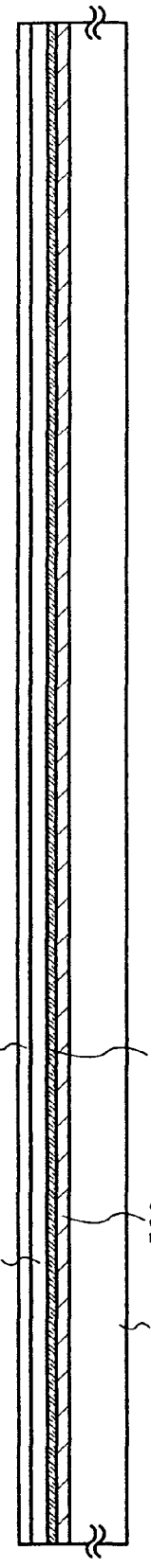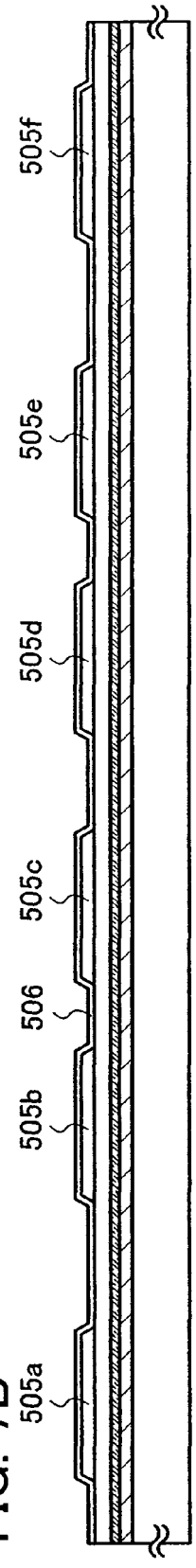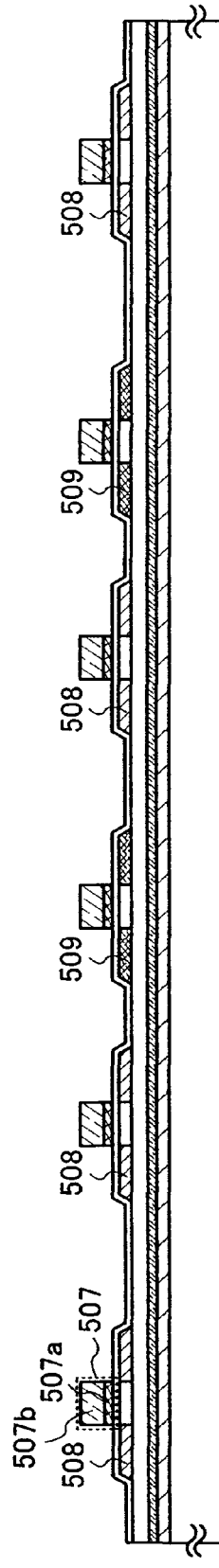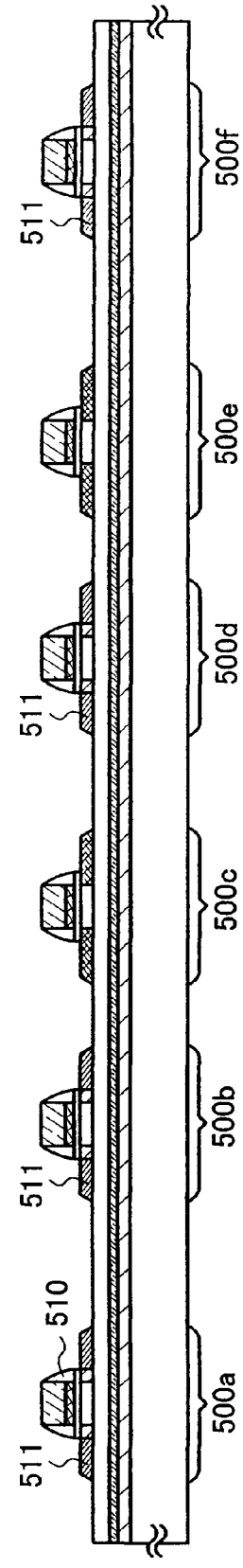

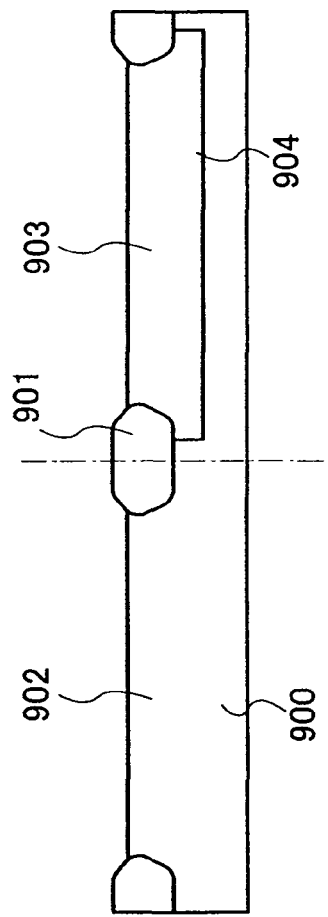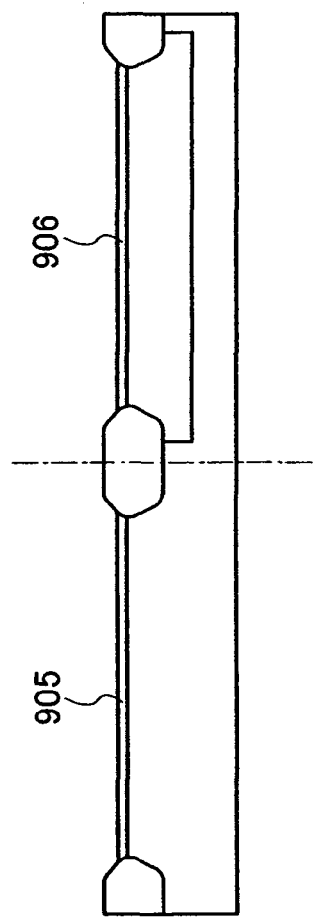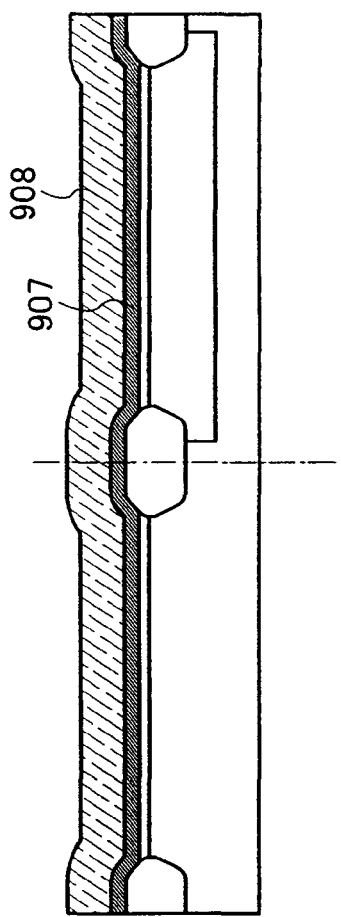

OSCILLATOR CIRCUIT HAVING A STABLE OUTPUT SIGNAL RESISTANT TO POWER SUPPLY VOLTAGE FLUCTUATION

BACKGROUND OF THE INVENTION

1. Field of the Invention

The present invention relates to an oscillator circuit and a semiconductor device including the oscillator circuit.

2. Description of the Related Art

In recent years, semiconductor devices in each of which various circuits are integrated on one insulating surface have been developed. As a clock circuit necessary for a circuit, various oscillator circuits are known.

Oscillator circuits have been developed using CMOSs, and an oscillator circuit using a CMOS inverter is given as a typical example (for example, Patent Document 1: Japanese Published Patent Application No. 2003-283307).

SUMMARY OF THE INVENTION

However, a conventional oscillator circuit has the following problem. When a power supply voltage supplied to an oscillator circuit fluctuates, the value of a current flowing through an inverter is changed and thus an oscillation frequency is changed. Therefore, in a case where an output from the oscillator circuit is used as a clock signal, if the oscillation frequency fluctuates, the clock signal is changed, resulting in a circuit malfunction.

Further, in a case of obtaining a power supply voltage with the use of a radio signal such as an external radio wave or electromagnetic wave in an RFID (radio frequency identification) tag or the like which has recently attracted attention as a semiconductor device for communicating data by wireless communication, the power supply voltage fluctuates easily in accordance with a distance from a place where a signal is generated and the fluctuation in the power supply voltage changes an oscillation frequency.

An oscillation frequency is easily affected by a ripple of a power supply voltage or a noise due to a wireless signal; therefore, it is difficult to stabilize an oscillation frequency.

In view of the above problems, an object of the present invention is to provide an oscillator circuit which suppresses a fluctuation in an oscillation frequency due to a fluctuation in a power supply voltage and outputs a signal with a more stable frequency and a semiconductor device including the oscillator circuit.

One mode of the present invention is an oscillator circuit including a constant current circuit which supplies a constant current regardless of a potential difference between power supply voltage terminals, a voltage controlled oscillator circuit of which an oscillation frequency fluctuates in accordance with the potential difference between the power supply voltage terminals, an n-channel transistor, a p-channel transistor, and a capacitor. Note that the power supply voltage terminals are a first terminal and a second terminal and a power supply voltage is supplied from the terminals.

In the voltage controlled oscillator circuit of the above structure, in a case where a potential difference between the power supply voltage terminals is constant, an oscillation frequency can be changed in accordance with a voltage of an input terminal of the voltage controlled oscillator. Note that as the voltage of the input terminal of the voltage controlled oscillator is higher, the oscillation frequency is higher and as the voltage of the input terminal is lower, the oscillation frequency is lower. In a case where the voltage of the input terminal of the voltage controlled oscillator is constant, the oscillation frequency is changed in accordance with a potential difference between the power supply voltage terminals. In that case, as the potential difference between the power supply voltage terminals is larger, the oscillation frequency is lower and as the potential difference between the power supply voltage terminals is smaller, the oscillation frequency is higher.

The constant current circuit and a gate electrode of the p-channel transistor are connected at a second node, and a source electrode of the p-channel transistor is connected to the first terminal. Note that a current corresponding to a current value of the constant current circuit can be supplied to the p-channel transistor.

A drain electrode of the p-channel transistor is connected to a drain electrode of the n-channel transistor, and a source electrode of the n-channel transistor is connected to the second terminal. Note that a voltage is generated at a gate electrode of the n-channel transistor due to a current flowing through the p-channel transistor.

The voltage controlled oscillator circuit and the gate electrode of the n-channel transistor are connected at a first node, and an oscillation frequency of the voltage controlled oscillator circuit is determined depending on a voltage generated in/to the gate electrode of the n-channel transistor. The first node is also connected to the second terminal through the capacitor. The first node corresponds to the input terminal of the voltage controlled oscillator in the voltage controlled oscillator circuit.

In a case where the potential difference between the power supply voltage terminals is changed, the current flowing through the constant current circuit is constant. However, the current of the p-channel transistor connected to the constant current circuit is changed in accordance with a drain-source voltage even in a case where the gate-source voltage is constant. When the current of the p-channel transistor is changed, a voltage of a gate terminal of the n-channel transistor is changed.

In a case where the potential difference between the power supply voltage terminals changes and the voltage of the input terminal of the voltage controlled oscillator circuit is constant, the oscillation frequency of the voltage controlled oscillator circuit fluctuates in accordance with the potential difference between the power supply voltage terminals. In the present invention, the voltage of the gate terminal of the n-channel transistor fluctuates; therefore, a fluctuation in an oscillation frequency in accordance with a potential difference between the power supply voltage terminals can be suppressed.

Note that the capacitor connected to the first node can suppress a voltage fluctuation at the first node in a case where the potential difference between the power supply voltage terminals significantly changes.

Another mode of the present invention is an oscillator circuit including a constant current circuit which is electrically connected between a first terminal and a second terminal, a voltage controlled oscillator circuit of which an oscillation frequency fluctuates in accordance with a potential difference between the power supply voltage terminals, an n-channel transistor, a p-channel transistor in which a gate-source voltage is set to be constant by the constant current circuit, and a capacitor, in which one of a source electrode and a drain electrode of the p-channel transistor is electrically connected to the first terminal, the other of the source electrode and the drain electrode of the p-channel transistor is electrically connected to a gate electrode and one of a source electrode and a drain electrode of the n-channel transistor, the other of the source electrode and the drain electrode of the n-channel transistor is electrically connected to the second terminal, and the gate electrode of the n-channel transistor is electrically connected to the second terminal through the capacitor. Note that the gate electrode of the n-channel transistor corresponds to an input terminal of the voltage controlled oscillator circuit, and the first terminal and the second terminal correspond to the power supply voltage terminals in the voltage controlled oscillator circuit. The constant current circuit does not necessarily include a resistor.

Another mode of the present invention is an oscillator circuit including a constant current circuit which is electrically connected between a first terminal and a second terminal, a voltage controlled oscillator circuit of which an oscillation frequency fluctuates in accordance with a potential difference between the power supply voltage terminals, a p-channel transistor, an n-channel transistor in which a gate-source voltage is set to be constant by the constant current circuit, and a capacitor, in which one of a source electrode and a drain electrode of the n-channel transistor is electrically connected to the second terminal, the other of the source electrode and the drain electrode of the n-channel transistor is electrically connected to a gate electrode and one of a source electrode and a drain electrode of the p-channel transistor, the other of the source electrode and the drain electrode of the p-channel transistor is electrically connected to the first terminal, and the gate electrode of the p-channel transistor is electrically connected to the first terminal through the capacitor. Note that the gate electrode of the p-channel transistor corresponds to an input terminal of the voltage controlled oscillator circuit, and the first terminal and the second terminal correspond to the power supply voltage terminals in the voltage controlled oscillator circuit. The constant current circuit does not necessarily include a resistor.

Another mode of the present invention is a semiconductor device including a signal processing circuit and an antenna circuit which transmits and receives a signal for transmitting data stored in the signal processing circuit, in which the signal processing circuit includes the oscillator circuit with the above structure and a rectifier circuit which generates a power supply voltage from a signal received from the antenna circuit, and the power supply voltage is supplied to a first terminal and a second terminal of the oscillator circuit.

Another mode of the present invention is a semiconductor device including a signal processing circuit and an antenna circuit which transmits and receives a signal for transmitting data stored in the signal processing circuit, in which the signal processing circuit includes the oscillator circuit with the above structure, a rectifier circuit which generates a power supply voltage from a signal received from the antenna circuit, and a power supply circuit, and the power supply voltage is supplied to a first terminal and a second terminal of the oscillator circuit through the power supply circuit. Note that the power supply circuit may be a regulator circuit.

Further, the semiconductor device of the above structure may include a battery which stores a power supply voltage.

A transistor is not particularly limited in the present invention. A thin film transistor (TFT) using a non-single crystalline semiconductor film typified by amorphous silicon or polycrystalline silicon, a transistor formed using a semiconductor substrate or an SOI substrate, a junction transistor, a bipolar transistor, a transistor using a compound semiconductor of ZnO, a—InGaZnO, or the like, a transistor using an organic semiconductor or a carbon nanotube, or the like can be applied. Furthermore, a substrate provided with a transistor is not exclusively limited to a certain type. For example, a single crystalline substrate, an SOI substrate, a glass substrate, a plastic substrate, or the like can be used.

Note that in the present invention, "being connected" means "being electrically connected". Therefore, in the structure disclosed in the present invention, another element which enables an electrical connection (for example, a switch, a transistor, a capacitor, an inductor, a resistor, a diode, or the like) may be provided in a predetermined structure, for example, the structure shown in drawings or descriptions. It is needless to say that another element is not necessarily provided, and "being electrically connected" also means "being directly connected".

By using the present invention, an oscillator circuit which is not easily affected by a noise due to a fluctuation in power and which outputs a signal having a stable frequency with less fluctuation in a wide range of voltages. The oscillator circuit of the present invention makes it possible to generate a stable clock signal and accordingly, a semiconductor device which is highly reliable and can transmit and receive data wirelessly can be provided.

BRIEF DESCRIPTION OF THE DRAWINGS

FIG. 3 is a diagram showing a structure of a semiconductor device of the present invention.

FIGS. 7A to 7D are partial cross-sectional views of a semiconductor device of the present invention.

FIGS. 10A to 10C are partial cross-sectional views of transistors included in an oscillator circuit or a semiconductor device of the present invention.

DETAILED DESCRIPTION OF THE INVENTION

Figure 1:
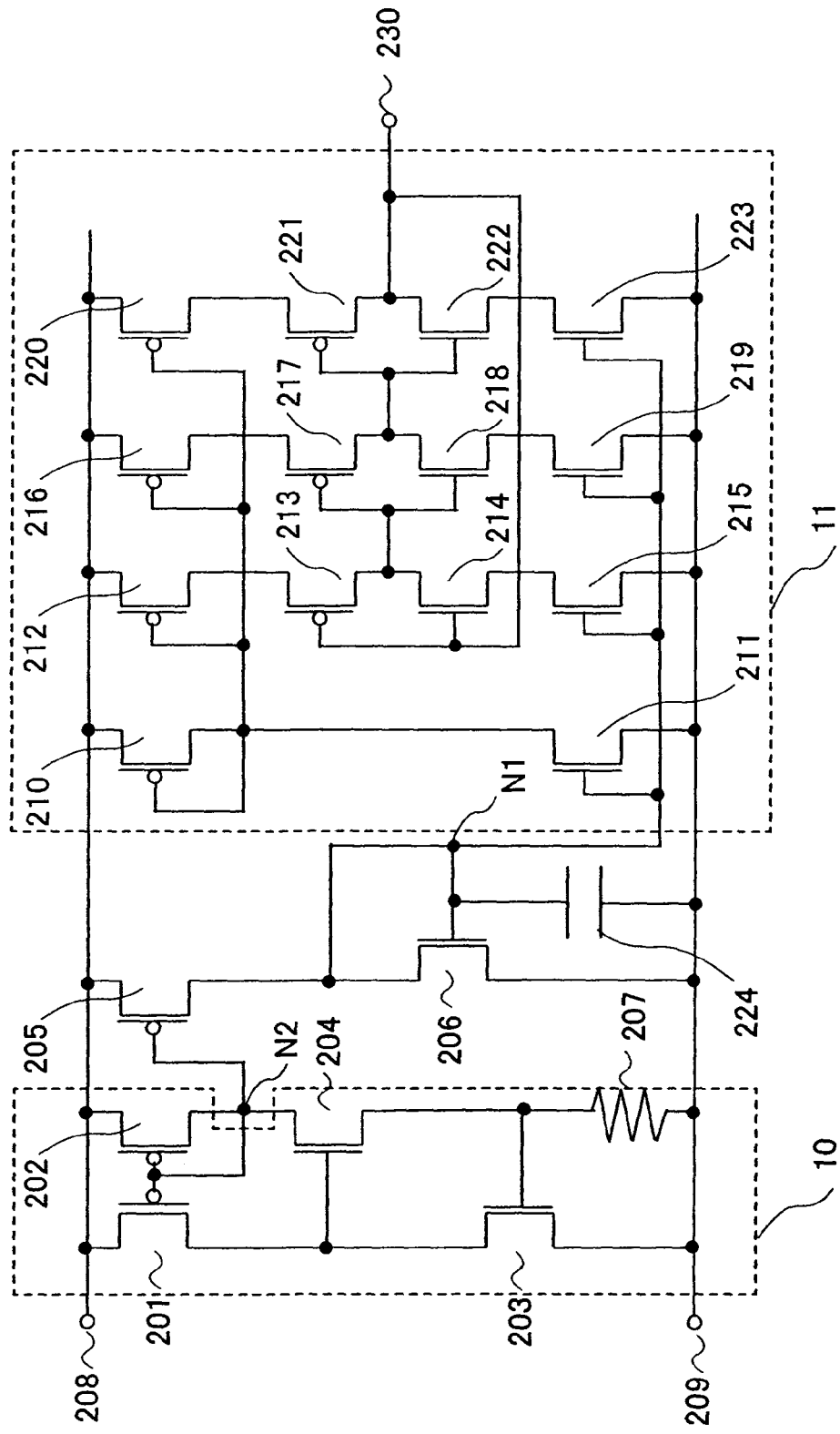
FIG. 1 is a diagram showing an oscillator circuit of the present invention.

Although the present invention will be fully described by way of embodiment modes with reference to the accompanying drawings, it is to be understood by those skilled in the art that various changes and modifications can be made without departing from the spirit and scope of the present invention. Therefore, the present invention should not be construed as being limited to the description in the following embodiment modes. Note that common portions and portions having a similar function are denoted by the same reference numerals in all diagrams for describing embodiment modes, and description thereof is omitted.

EMBODIMENT MODE 1

FIG. 1 shows a structure of an oscillator circuit of the present invention. In FIG. 1, a terminal 208 is an input voltage terminal and a terminal 209 is a reference voltage terminal of an input voltage. Note that in this specification, the input voltage terminal and the reference voltage terminal of an input voltage are also referred to as a first terminal and a second terminal respectively and may be collectively referred to as power supply voltage terminals. A gate electrode and a source electrode of an n-channel transistor (hereinafter referred to as NMOS) 206 are connected to a node N1 and the terminal 209, respectively. A drain electrode of a p-channel transistor (hereinafter referred to as PMOS) 205 and a drain electrode of the NMOS 206 are connected and a connection portion thereof is connected to the node N1. A source electrode and a gate electrode of the PMOS 205 are connected to the terminal 208 and a node N2, respectively. In addition, the node N1 is connected to the terminal 209 through a capacitor 224. With a voltage of the node N2, a current flows through the PMOS 205, and a connection between the NMOS 206 and the PMOS 205 allows the current to flow through the NMOS 206 as well. When the current flows through the NMOS 206, a voltage corresponding to the current is generated at the node N1. Note that the capacitor 224 can suppress a voltage fluctuation caused by the NMOS 206, even when the current of the PMOS 205 changes and a voltage of the node N2 or a voltage of the terminal 208 fluctuates significantly.

A constant current circuit 10 is connected to the node N2.

The constant current circuit 10 includes a current mirror circuit including PMOSs 201 and 202, NMOSs 203 and 204, and a resistor 207. Gate electrodes of the PMOSs 201 and 202 and a drain electrode of the PMOS 202 are connected to the node N2, and source electrodes of the PMOSs 201 and 202 are connected to the terminal 208. A drain electrode of the PMOS 201 is connected to a gate electrode of the NMOS 204 and a drain electrode of the NMOS 203. A drain electrode of the NMOS 204 is connected to the node N2. A source electrode of the NMOS 204 is connected to a gate electrode of the NMOS 203 and is connected to the terminal 209 through the resistor 207. A source electrode of the NMOS 203 is connected to the terminal 209.

The constant current circuit 10 can supply a constant current flowing through the resistor 207 to the NMOSs 203 and 204 and PMOSs 201 and 202. Note that the constant current flowing through the resistor 207 can be changed in accordance with a resistance value of the resistor 207. Thus, a voltage corresponding to the constant current flowing through the resistor 207 is generated at the node N2.

On the other hand, a voltage controlled oscillator circuit 11 is connected to the node N1.

The voltage controlled oscillator circuit 11 includes PMOSs 210, 212, 213, 216, 217, 220, and 221, and NMOSs 211, 214, 215, 218, 219, 222, and 223. Gate electrodes of the NMOSs 211, 215, 219, and 223 are connected to the node N1. Source electrodes of the NMOSs 211, 215, 219, and 223 are connected to the terminal 209. Source electrodes of the PMOSs 210, 212, 216, and 220 are connected to the terminal 208. A drain electrode of the NMOS 211 is connected to a gate electrode and a drain electrode of the PMOS 210 and gate electrodes of the PMOSs 212, 216, and 220. A drain electrode of the PMOS 212 is connected to a source electrode of the PMOS 213. A drain electrode of the PMOS 216 is connected to a source electrode of the PMOS 217. A drain electrode of the PMOS 220 is connected to a source electrode of the PMOS 221. A drain electrode of the NMOS 215 is connected to a source electrode of the NMOS 214. A drain electrode of the NMOS 219 is connected to a source electrode of the NMOS 218. A drain electrode of the NMOS 223 is connected to a source electrode of the NMOS 222. A drain electrode of the PMOS 213 is connected to a drain electrode of the NMOS 214, a gate electrode of the PMOS 217, and a gate electrode of the NMOS 218. A drain electrode of the PMOS 217 is connected to a drain electrode of the NMOS 218, a gate electrode of the PMOS 221, and a gate electrode of the NMOS 222. A drain electrode of the PMOS 221 is connected to a drain electrode of the NMOS 222, a gate electrode of the PMOS 213, and a gate electrode of the NMOS 214, and an output terminal 230.

A current to be supplied to the NMOSs 211, 215, 219, and 223 is determined depending on a voltage generated at the node N1. A current similar to that of the NMOS 211 flows through the PMOS 210. Therefore, a voltage corresponding to the current flowing through the PMOS 210 is generated at the gate electrode of the PMOS 210. A current to be supplied to the PMOSs 212, 216, and 220 is determined depending on the voltage generated at the gate electrode of the PMOS 210.

Note that the PMOS 213 and the NMOS 214 have an inverter structure in which the gate electrodes thereof are input terminals and the drain electrodes thereof are output terminals. Similarly, the PMOS 217 and the NMOS 218, and the PMOS 221 and the NMOS 222 have inverter structures. An input terminal included in each inverter is connected to an output terminal included in another inverter, which forms a feedback circuit in which an output signal is an input signal. This is referred to as a ring oscillator and can output a signal having a frequency from the output terminal 230. Note that since the current corresponding to the voltage of the node N1 flows through the PMOS and the NMOS that are included in each inverter, an oscillation frequency fluctuates in accordance with a current to be supplied. That is, an oscillation frequency can be changed in accordance with the voltage of the node N1.

Next, a behavior of the above oscillator circuit is described. When a voltage is applied between the terminals 208 and 209, the current flows through the PMOS 205 from the constant current circuit 10 with the voltage generated at the node N2. In addition, the current similar to that of the PMOS 205 flows through the NMOS 206, and a voltage corresponding to the current is generated at the node N1. Thus, the voltage controlled oscillator circuit 11 connected to the node N1 at which a voltage is generated outputs a signal having a frequency corresponding to the voltage generated at the node N1.

Note that even when a voltage between the terminal 208 and the terminal 209 is increased, the constant current circuit 10 supplies a constant current; therefore, a gate-source voltage of the PMOS 205 does not change. The current flowing through the PMOS 205 changes in accordance with a drain-source voltage of the PMOS 205 even in a case where the gate-source voltage of the PMOS 205 is constant. Thus, when the current of the PMOS 205 changes, the current flowing through the NMOS 206 is changed and thus the voltage generated at the node N1 is changed.

Note that the voltage controlled oscillator circuit 11 outputs a signal having the frequency corresponding to the voltage of the node N1 in a case where the voltage between the terminal 208 and the terminal 209 is constant. In a case where the voltage of the node N1 fluctuates from V1 to V2 (V1<V2), if a frequency corresponding to V1 is F1 and a frequency corresponding to V2 is F2, F2 is higher than F1 (F1<F2). On the other hand, in a case where the voltage of the node N1 is constant, the voltage controlled oscillator circuit 11 outputs a signal having a frequency corresponding to the voltage between the terminal 208 and the terminal 209. In a case where the voltage between the terminal 208 and the terminal 209 fluctuates from V3 to V4 which is higher than V3 (V3<V4), if a frequency corresponding to V3 is F3 and a frequency corresponding to V4 is F4, F4 is lower than F3 (F3>F4).

For example, even in a case where the voltage between the terminal 208 and the terminal 209 increases, the voltage of the node N1 also increases at the same time; therefore, an oscillation frequency of the voltage controlled oscillator circuit 11 can be stabilized. On the other hand, in a case where the voltage between the terminal 208 and the terminal 209 decreases, the voltage of the node N1 also decreases at the same time; therefore, the oscillation frequency of the voltage controlled oscillator circuit 11 can be stabilized.

As described above, even in a case where the voltage between the terminal 208 and the terminal 209 fluctuates, the oscillator circuit of the present invention can suppress a fluctuation in an oscillation frequency and thereby output a signal having a more stable frequency.

The constant current circuit 10 is not limited to the above mode and any structure may be adopted as long as it is a structure in which a constant current is supplied and the gate-source voltage of the PMOS 205 is constant.

The voltage controlled oscillator circuit 11 is not limited to the above mode and any structure may be adopted as long as it is a structure in which a signal having a frequency is generated with the voltage of the node N1.

EMBODIMENT MODE 2

Figure 2:
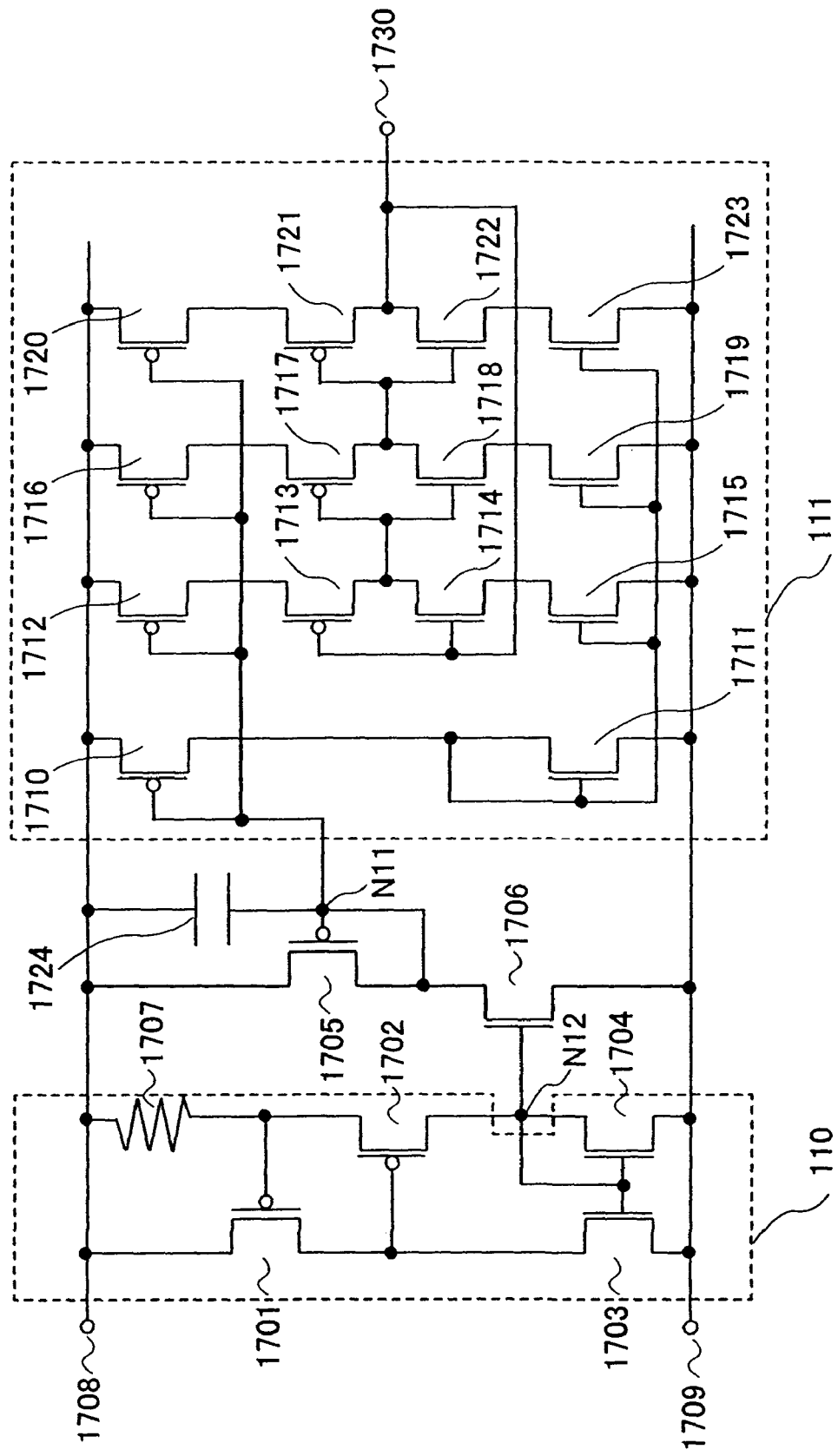
FIG. 2 is a diagram showing an oscillator circuit of the present invention.

In this embodiment mode, FIG. 2 shows a structure of an oscillator circuit of the present invention, which is different from that of Embodiment Mode 1. In FIG. 2, a terminal 1708 is an input voltage terminal, and a terminal 1709 is a reference voltage terminal of an input voltage. A gate electrode and a source electrode of a PMOS 1705 are connected to a node N11 and the terminal 1708, respectively. A drain electrode of the PMOS 1705 and a drain electrode of an NMOS 1706 are connected and a connection portion thereof is connected to the node N11. A source electrode and a gate electrode of the NMOS 1706 are connected to the terminal 1709 and a node N12, respectively. The node N11 is connected to the terminal 1708 through a capacitor 1724. With a voltage of the node N12, a current flows through the NMOS 1706, and a connection between the PMOS 1705 and the NMOS 1706 allows the current to flow through the PMOS 1705 as well. When the current flows through the PMOS 1705, a voltage corresponding to the current is generated at the node N11. Note that the capacitor 1724 can suppress a fluctuation in a voltage generated by the PMOS 1705 even when a current of the NMOS 1706 changes, in a case where the voltage of the node N12 or a voltage of the terminal 1708 fluctuates significantly.

A constant current circuit 110 is connected to the node N12.

The constant current circuit 110 includes a current mirror circuit including PMOSs 1701 and 1702, NMOSs 1703 and 1704, and a resistor 1707. Gate electrodes of the NMOSs 1703 and 1704 and a drain electrode of the NMOS 1704 are connected to the node N12. Source electrodes of the NMOSs 1703 and 1704 are connected to a terminal 1709. A drain electrode of the NMOS 1703 is connected to a gate electrode of the PMOS 1702 and a drain electrode of the PMOS 1701. A drain electrode of the PMOS 1702 is connected to the node N12. A source electrode of the PMOS 1702 is connected to a gate electrode of the PMOS 1701 and is connected to the terminal 1708 thorough the resistor 1707. A source electrode of the PMOS 1701 is connected to the terminal 1708.

The constant current circuit 110 can supply a constant current flowing through the resistor 1707 to the PMOSs 1701 and 1702 and NMOSs 1703 and 1704. Note that the constant current flowing through the resistor 1707 can be changed in accordance with a resistance value of the resistor 1707. Thus, the voltage corresponding to the constant current flowing through the resistor 1707 is generated at the node N12.

On the other hand, a voltage controlled oscillator circuit 111 is connected to the node N11.

The voltage controlled oscillator circuit 111 includes PMOSs 1710, 1712, 1713, 1716, 1717, 1720, and 1721, and NMOSs 1711, 1714, 1715, 1718, 1719, 1722, and 1723. Gate electrodes of the PMOSs 1710, 1712, 1716, and 1720 are connected to the node N11. Source electrodes of the PMOSs 1710, 1712, 1716, and 1720 are connected to the terminal 1708. Source electrodes of the NMOSs 1711, 1715, 1719, and 1723 are connected to the terminal 1709. A drain electrode of the PMOS 1710 is connected to a gate electrode and a drain electrode of the NMOS 1711 and gate electrodes of the NMOSs 1715, 1719, and 1723. A drain electrode of the PMOS 1712 is connected to a source electrode of the PMOS 1713. A drain electrode of the PMOS 1716 is connected to a source electrode of the PMOS 1717. A drain electrode of the PMOS 1720 is connected to a source electrode of the PMOS 1721. A drain electrode of the NMOS 1715 is connected to a source electrode of the NMOS 1714. A drain electrode of the NMOS 1719 is connected to a source electrode of the NMOS 1718. A drain electrode of the NMOS 1723 is connected to a source electrode of the NMOS 1722. A drain electrode of the PMOS 1713 is connected to a drain electrode of the NMOS 1714, a gate electrode of the PMOS 1717, and a gate electrode of the NMOS 1718. A drain electrode of the PMOS 1717 is connected to a drain electrode of the NMOS 1718, a gate electrode of the PMOS 1721, and a gate electrode of the NMOS 1722. A drain electrode of the PMOS 1721 is connected to a drain electrode of the NMOS 1722, a gate electrode of the PMOS 1713, a gate electrode of the NMOS 1714, and an output terminal 1730.

A current to be supplied to the PMOSs 1710, 1712, 1716, and 1720 is determined depending on the voltage generated at the node N11. A current similar to that of the PMOS 1710 flows through the NMOS 1711. Therefore, a voltage corresponding to the current flowing through the NMOS 1711 is generated at the gate electrode of the NMOS 1711. A current to be supplied to the NMOSs 1715, 1719, and 1723 is determined depending on the voltage generated at the gate electrode of the NMOS 1711.

Note that the PMOS 1713 and the NMOS 1714 have an inverter structure in which the gate electrodes thereof are input terminals and the drain electrodes thereof are output terminals. Similarly, the PMOS 1717 and the NMOS 1718, and the PMOS 1721 and the NMOS 1722 have inverter structures. An input terminal included in each inverter is connected to an output terminal included in another inverter, which forms a feedback circuit in which an output signal is an input signal. This is referred to as a ring oscillator and can output a signal having a frequency from the output terminal 1730. Note that since the current corresponding to the voltage of the node N11 flows through the PMOS and the NMOS included in each inverter, an oscillation frequency fluctuates in accordance with a current to be supplied. That is, a signal having a frequency can be changed in accordance with the voltage of the node N11.

Next, a behavior of the above oscillator circuit is described. When a voltage is applied between the terminals 1708 and 1709, the current flows through the NMOS 1706 from the constant current circuit 110 with the voltage generated at the node N12. In addition, the current similar to that of the NMOS 1706 flows through the PMOS 1705, and the voltage corresponding to the current is generated at the node N11. Thus, the voltage controlled oscillator circuit 111 connected to the node N11 at which a voltage is generated outputs a signal having the frequency corresponding to the voltage generated at the node N11.

Note that even when the voltage between the terminal 1708 and the terminal 1709 is increased, the constant current circuit 110 supplies a constant current; therefore, a gate-source voltage of the NMOS 1706 is not changed. The current flowing through the NMOS 1706 changes in accordance with a drain-source voltage of the NMOS 1706 even in a case where the gate-source voltage of the NMOS 1706 is constant. Thus, when the current of the NMOS 1706 changes, the current flowing through the PMOS 1705 is changed and thus the voltage generated at the node N11 is changed.

Note that the voltage controlled oscillator circuit 111 outputs a signal having a frequency corresponding to the voltage between the terminal 1708 and the node N11 in a case where the voltage between the terminal 1708 and the terminal 1709 is constant. In a case where the voltage between the terminal 1708 and the node N11 fluctuates from V5 to V6 which is higher than V5 (V5<V6), if a frequency corresponding to V5 is F5 and a frequency corresponding to V6 is F6, F6 is higher than F5 (F5<F6). On the other hand, in a case where the voltage between the terminal 1708 and the node N11 is constant, the voltage controlled oscillator circuit 111 outputs a signal having a frequency corresponding to the voltage between the terminal 1708 and the terminal 1709. In a case where the voltage between the terminal 1708 and the terminal 1709 fluctuates from V7 to V8 which is higher than V7 (V7<V8), if a frequency corresponding to V7 is F7 and a frequency corresponding to V8 is F8, F8 is lower than F7 (F7>F8).

For example, even in a case where the voltage between the terminal 1708 and the terminal 1709 increases, the voltage between the terminal 1708 and the node N11 also increases at the same time; therefore, an oscillation frequency of the voltage controlled oscillator circuit 111 can be stabilized. On the other hand, in a case where the voltage between the terminal 1708 and the terminal 1709 decreases, the voltage of the node N11 also decreases at the same time; therefore, the oscillation frequency of the voltage controlled oscillator circuit 111 can be stabilized.

As described above, even in a case where the voltage between the terminal 1708 and the terminal 1709 fluctuates, the oscillator circuit of the present invention can suppress a fluctuation in an oscillation frequency and thereby output a signal having a more stable frequency.

The constant current circuit 110 is not limited to the above mode and any structure may be adopted as long as it is a structure in which a constant current is supplied and the gate-source voltage of the NMOS 1706 is constant.

The voltage controlled oscillator circuit 111 is not limited to the above mode and any structure may be adopted as long as it is a structure in which a signal having a frequency is generated with the voltage between the terminal 1708 and the node N11.

EMBODIMENT MODE 3

In this embodiment mode, a semiconductor device which has the oscillator circuit described in the above embodiment modes and can transmit and receive data wirelessly is described with reference to drawings.

In recent years, semiconductor devices each combining a micro IC chip and an antenna for wireless communication, such as RFID tags, have attracted lots of attention. An RFID tag can write and read data by transmitting and receiving a communication signal with the use of a wireless communication device (also referred to as a reader/writer). Note that an RFID tag (hereinafter simply referred to as an RFID) is also called an IC (Integrated Circuit) tag, an IC chip, an RF tag, a wireless tag, or an electronic tag.

As an application field of a semiconductor device which can transmit and receive data wirelessly, such as an RFID, product management in the distribution industry is given as an example. Product management using bar codes or the like is mainstream at present; however, since bar codes are read optically, data cannot be read when there is an interrupting object. On the other hand, since an RFID reads data wirelessly, data can be read even when there is an interrupting object. Thus, improvement in efficiency, cost reduction, and the like in product management have been expected. Further, a wide range of applications including boarding passes, airplane tickets, and automatic fare payment has been expected.

As such an RFID, one mode of the semiconductor device using the present invention is described with reference to a block diagram shown in FIG. 3.

An RFID 300 in FIG. 3 includes an antenna circuit 301 and a signal processing circuit 302. The signal processing circuit 302 includes a rectifier circuit 303, a power supply circuit 304, a demodulation circuit 305, an oscillator circuit 306, a logic circuit 307, a memory control circuit 308, a memory circuit 309, a logic circuit 310, an amplifier 311, and a modulation circuit 312.

In the RFID 300, a communication signal received by the antenna circuit 301 is inputted to the demodulation circuit 305 in the signal processing circuit 302. As a frequency of the received communication signal, that is, a signal transmitted and received between the antenna circuit 301 and a reader/writer, 125 kHz, 13.56 MHz, 915 MHz, 2.45 GHz, and the like are given, each of which is standardized by the ISO standard. It is needless to say that a frequency of the signal transmitted and received between the antenna circuit 301 and the reader/writer is not limited to them, and any of the following may be adopted: a submillimeter wave of 300 GHz to 3 THz; a millimeter wave of 30 GHz to 300 GHz; a microwave of 3 GHz to 30 GHz; an ultrahigh frequency wave of 300 MHz to 3 GHz; a very high frequency wave of 30 MHz to 300 MHz; a short wave of 3 MHz to 30 MHz; a medium wave of 300 kHz to 3 MHz; a long wave of 30 kHz to 300 kHz; and a very low frequency wave of 3 kHz to 30 kHz. Further, a signal transmitted/received between the first antenna circuit 301 and the reader/writer is a signal obtained by modulating a carrier wave. A carrier wave may be modulated by either analog modulation or digital modulation, and any of amplitude modulation, phase modulation, frequency modulation, and spread spectrum modulation may be adopted. Preferably, amplitude modulation or frequency modulation is adopted.

In this embodiment mode, a case where a carrier wave as a communication signal has a frequency of 915 MHz is described. Note that in an RFID, a clock signal which is a standard is necessary in order to process a signal, and here, a clock signal is generated using the oscillator circuit 306 described in Embodiment Mode 1 or 2. An oscillation signal outputted from the oscillator circuit 306 is supplied as a clock signal to the logic circuit 307. A modulated carrier wave is demodulated by the demodulation circuit 305. The demodulated signal is also transmitted to the logic circuit 307 to be analyzed. The signal analyzed by the logic circuit 307 is transmitted to the memory control circuit 308, and based on that, the memory control circuit 308 controls the memory circuit 309 and takes out data stored in the memory circuit 309 and then transmits the data to the logic circuit 310. The signal transmitted to the logic circuit 310 is encoded by the logic circuit 310 and then amplified by the amplifier 311. By the signal, the modulation circuit 312 modulates a carrier wave. By the modulated carrier wave, the reader/writer recognizes a signal from the RFID. On the other hand, a carrier wave entering the rectifier circuit 303 is rectified and then inputted to the power supply circuit 304. A power supply voltage obtained in such a manner is supplied to the demodulation circuit 305, the oscillator circuit 306, the logic circuit 307, the memory control circuit 308, the memory circuit 309, the logic circuit 310, the amplifier 311, the modulation circuit 312, and the like from the power supply circuit 304. Note that although the power supply circuit 304 is not always necessary, it has a function of stepping down, boosting, or inverting an input voltage here. Thus, the RFID 300 operates.

Figure 4A:
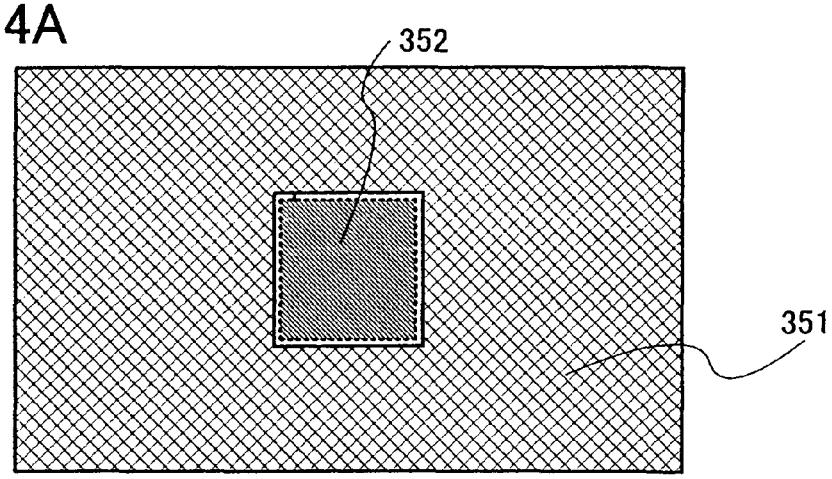
FIGS. 4A to 4E are diagrams each showing a structure of a semiconductor device of the present invention.
Figure 4B:
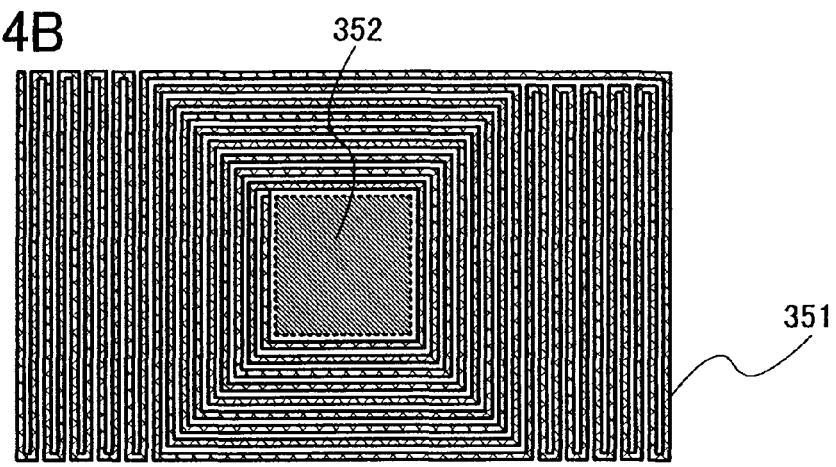
Figure 4C:
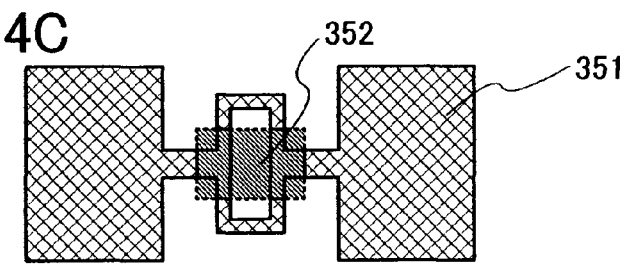
Figure 4D:
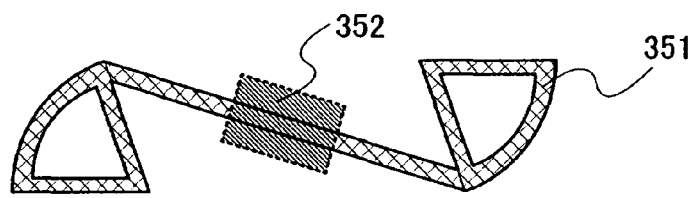
Figure 4E:
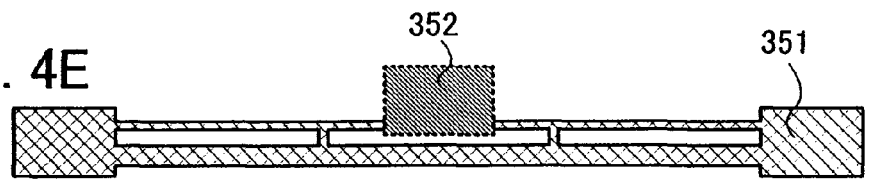

Note that the shape of an antenna in the antenna circuit 301 is not particularly limited. For example, as shown in FIG. 4A, an antenna 351 may be provided all around a signal processing circuit 352 over a substrate. As shown in FIG. 4B, the antenna 351 that is thin may be provided so as to surround the signal processing circuit 352 over a substrate. As shown in FIG. 4C, the antenna 351 may have a shape for receiving a high-frequency electromagnetic wave with respect to the signal processing circuit 352 over a substrate. As shown in FIG. 4D, the antenna 351 may have a shape with which it is 180° omnidirectional (capable of receiving signals in any direction) with respect to the signal processing circuit 352 over a substrate. As shown in FIG. 4E, the antenna 351 may have a shape which is extended to be long as a stick with respect to the signal processing circuit 352 over a substrate. Further, there is no particular limitation on a connection between the signal processing circuit and the antenna in the antenna circuit. For example, the antenna 351 and the signal processing circuit 352 may be connected by wire bonding connection or bump connection. Alternatively, a surface of the signal processing circuit 352 that is formed into a chip may be made to function as an electrode to be attached to the antenna 351. An ACF (anisotropic conductive film) can be used to attach the signal processing circuit 352 to the antenna 351. Note that an appropriate length necessary for an antenna varies depending on a frequency for receiving signals. For example, when a frequency is 2.45 GHz, the length of antenna may be approximately 60 mm (½ wavelength) in a case of providing a half-wave dipole antenna, and may be approximately 30 mm (¼ wavelength) in a case of providing a monopole antenna.

Note that the antenna 351 may be stacked over the same substrate as the signal processing circuit 352, or may be provided as an external antenna. It is needless to say that the antenna 351 may be provided above or below the signal processing circuit 352.

Figure 5A:
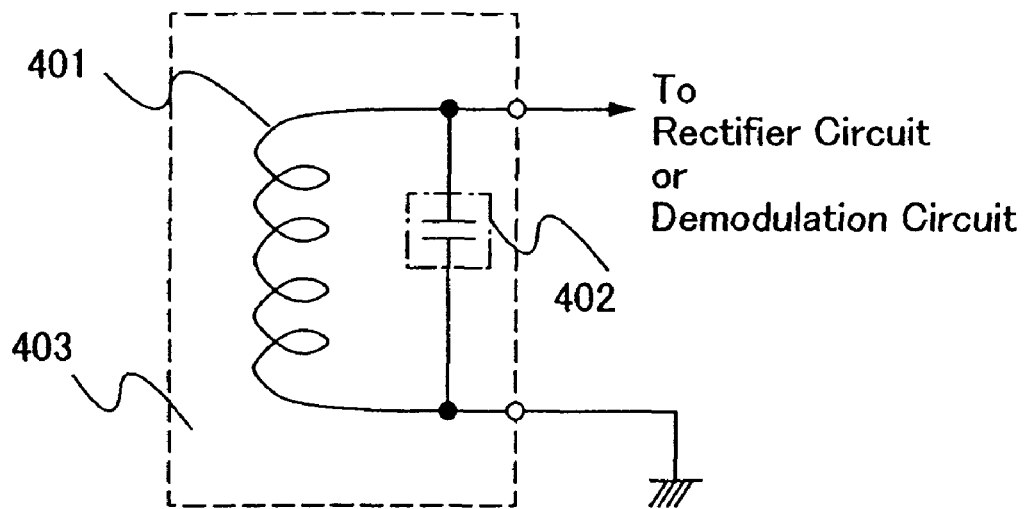
FIGS. 5A and 5B are diagrams each showing a structure of a semiconductor device of the present invention.

In a case where the shape of FIG. 4B is adopted for the antenna circuit 301 in FIG. 3, the antenna circuit 301 can be formed of an antenna 401 and a resonant capacitor 402 as shown in FIG. 5A. In such a case, the antenna 401 and the resonant capacitor 402 are collectively referred to as an antenna circuit 403.

Figure 5B:
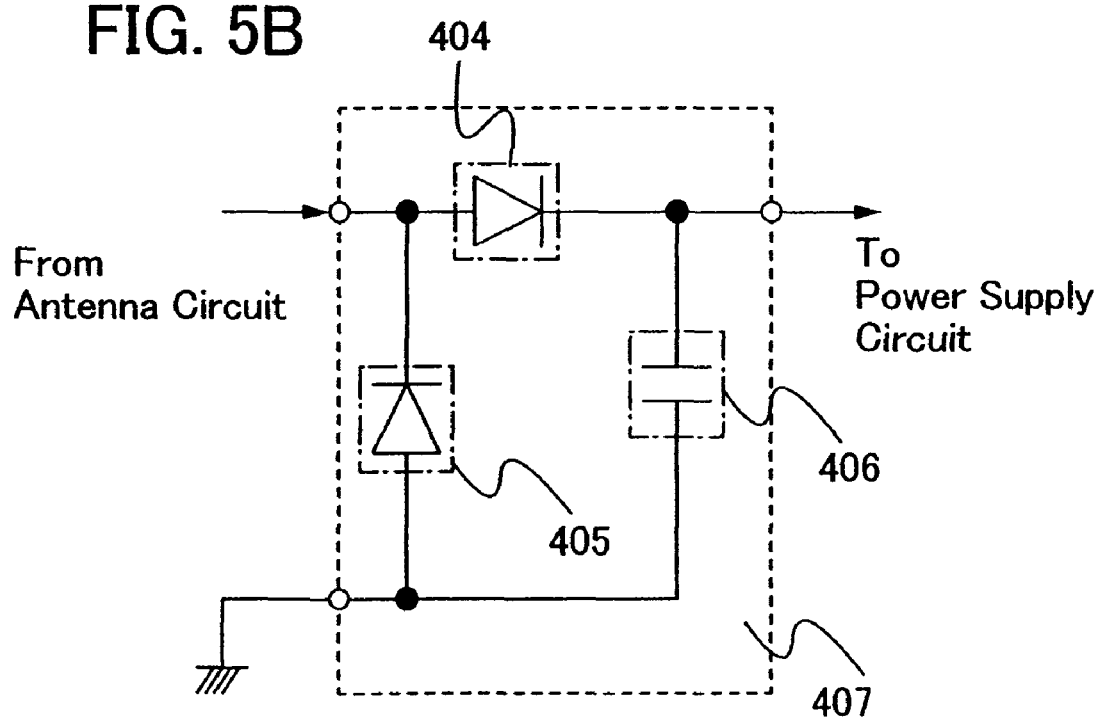

It is only necessary that the rectifier circuit 303 convert an AC signal introduced by a carrier wave which is received by the antenna circuit 301 into a DC signal. For example, the rectifier circuit 407 may be formed of a diode 404, a diode 405, and a smoothing capacitor 406 as shown in FIG. 5B.

As for an RFID, the value of the power supply voltage to be obtained fluctuates easily in accordance with a distance from the reader/writer, or the like. However, by using the oscillator circuit of the present invention, a clock signal is prevented from changing due to the value of the power supply voltage and a stable clock can be generated even when the value of the power supply voltage fluctuates. Therefore, a semiconductor device which is highly reliable and can transmit and receive data wirelessly can be obtained.

Figure 6:
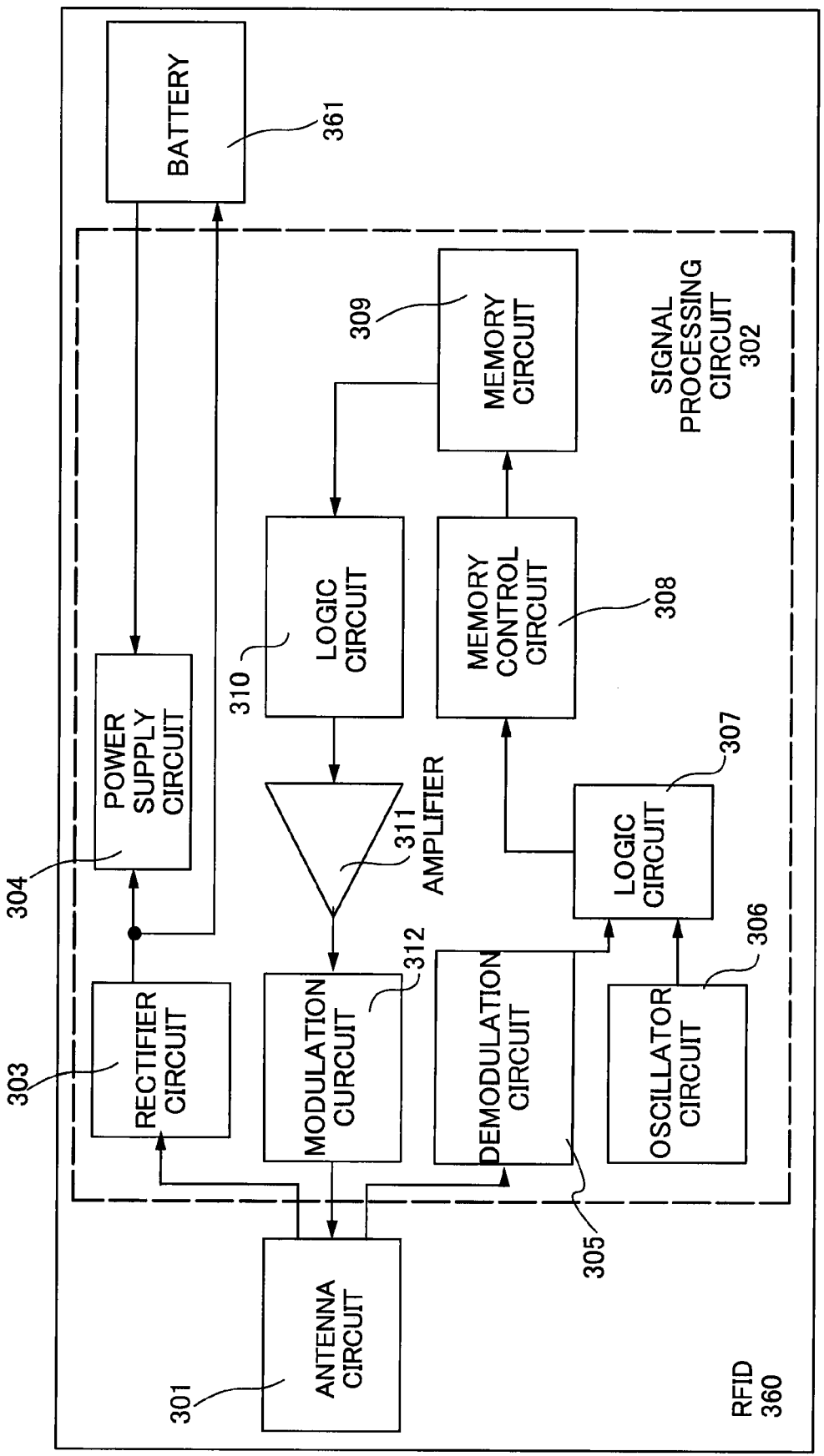
FIG. 6 is a diagram showing a structure of a semiconductor device of the present invention.

Note that the RFID in the present invention may include a battery 361 as shown in FIG. 6 in addition to the structure shown in FIG. 3. When a power supply voltage outputted from the rectifier circuit 303 is not high enough to operate the signal processing circuit 302, a power supply voltage can be supplied to various circuits included in the signal processing circuit 302, such as the demodulation circuit 305, the oscillator circuit 306, the logic circuit 307, the memory control circuit 308, the memory circuit 309, the logic circuit 310, the amplifier 311, the modulation circuit 312, and the like, from the battery 361. Note that even when the power supply voltage is supplied to the oscillator circuit 306 from the battery 361, a constant power supply voltage cannot be always supplied to the oscillator circuit 306 due to a noise caused by another analog circuit or a pulse noise caused by a digital circuit. Therefore, even in the case of the RFID 360 shown in FIG. 6, using the oscillator circuit of the present invention is effective and makes it possible to improve reliability of the RFID. For example, when the power supply voltage outputted from the rectifier circuit 303 is sufficiently higher than a power supply voltage necessary for operating the signal processing circuit 302, the battery 361 is supplied with a surplus of the power supply voltage to be outputted from the rectifier circuit 303 so that energy to be stored may be obtained. Alternatively, by providing another antenna circuit and another rectifier circuit in addition to the antenna circuit 301 and the rectifier circuit 303 in the RFID, energy to be stored in the battery 361 may be obtained from a radio wave generated randomly.

It is to be noted that a battery can restore continuous operating time by being charged. A battery formed to have a sheet shape is preferably used. For example, it is possible to reduce in size of an RFID with the use of a lithium polymer battery using a gel electrolyte, a lithium ion battery, a lithium secondary battery, or the like. Needless to say, any battery can be used as long as it can be charged, such as a nickel metal hydride battery or a nickel cadmium battery. Alternatively, a high-capacity capacitor or the like may be used.

A stable power supply voltage may be supplied to the power supply circuit 304 with the use of a regulator circuit. In this case, a constant power source voltage cannot be always supplied to the oscillator circuit 306 due to a noise caused by another analog circuit or a pulse noise caused by a digital circuit, similarly to the above case. Therefore, using the oscillator circuit of the present invention is effective and makes it possible to improve reliability of an RFID. It is needless to say that a regulator circuit can be used for a power supply circuit included in the RFID in FIG. 6.

This embodiment mode can be combined with any of the other embodiment modes in this specification as appropriate.

EMBODIMENT MODE 4

In this embodiment mode, an example of a method for manufacturing a semiconductor device such as an RFID, which is described in the above embodiment modes, is described with reference to partial cross-sectional views.

First, as shown in FIG. 7A, a release layer 503 is formed over a surface of a substrate 501 with an insulating film 502 interposed therebetween. Then, an insulating film 504 functioning as a base film and a semiconductor film 505 (for example, a film containing amorphous silicon) are stacked. Note that the insulating film 502, the release layer 503, the insulating film 504, and the semiconductor film 505 can be sequentially formed.

As the substrate 501, a glass substrate, a quartz substrate, a metal substrate (such as a stainless steel substrate), a ceramic substrate, or a semiconductor substrate such as a silicon substrate can be used. Alternatively, a substrate formed of polyethylene terephthalate (PET), polyethylene naphthalate (PEN), polyether sulfone (PES), acrylic, or the like can be used as a plastic substrate. Note that in this step, the release layer 503 is provided all over the substrate 501 with the insulating film 502 interposed therebetween; however, the release layer 503 may be selectively provided by a photolithography method if required after provision of the release layer over an entire surface of the substrate 501.

The insulating films 502 and 504 are each formed of an insulating material such as silicon oxide, silicon nitride, silicon oxynitride, or silicon nitride oxide, by a CVD method, a sputtering method, or the like. For example, in a case where the insulating films 502 and 504 each have a two-layer structure, a silicon nitride oxide film may be formed as a first insulating film and a silicon oxynitride film may be formed as a second insulating film. Alternatively, a silicon nitride film may be formed as the first insulating film and a silicon oxide film may be formed as the second insulating film. The insulating film 502 functions as a blocking layer for preventing an impurity element in the substrate 501 from being mixed into the release layer 503 or an element formed thereover. The insulating film 504 functions as a blocking layer for preventing an impurity element in the substrate 501 and the release layer 503 from being mixed into an element formed over the substrate 501 and the release layer 503. By forming the insulating films 502 and 504 each functioning as a blocking layer in this manner, it is possible to prevent alkaline metal or alkali earth metal such as Na in the substrate 501 and an impurity element included in the release layer 503 from adversely affecting an element to be formed over the substrate 501 and the release layer 503. In a case of using quartz for the substrate 501, the insulating films 502 and 504 may be omitted.

As the release layer 503, a metal film, a stacked layer structure of a metal film and a metal oxide film, or the like can be used. The metal film is formed as a single layer or stacked layers of a film formed of an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), and iridium (Ir), or an alloy material or a compound material containing any of the above elements as its main component. The metal film can be formed by a sputtering method, various CVD methods such as a plasma CVD method, or the like. As the stacked layer structure of a metal film and a metal oxide film, after the above metal film is formed, an oxide or oxynitride of the metal film can be formed on the metal film surface by performing plasma treatment in an oxygen atmosphere or an $N_2O$ atmosphere, or heat treatment in an oxygen atmosphere or an $N_2O$ atmosphere. For example, in a case where a tungsten film is formed by a sputtering method, a CVD method, or the like as the metal film, a metal oxide film of tungsten oxide can be formed on the tungsten film surface by performing plasma treatment to the tungsten film. In this case, an oxide of tungsten is expressed by $WO_x$, and x is 2 to 3. There are cases of x=2 ($WO_2$), x=2.5 ($W_2O_5$), x=2.75 ($W_4O_{11}$), x=3 ($WO_3$), and the like. When forming an oxide of tungsten, the value of x described above is not particularly restricted, and which oxide is to be formed may be decided based on an etching rate or the like. Alternatively, for example, a metal film (such as tungsten) is formed and then an insulating film of silicon oxide ($SiO_2$) or the like is formed over the metal film by a sputtering method, and a metal oxide may be formed over the metal film (for example, tungsten oxide over tungsten). Further, as plasma treatment, the above high-density plasma treatment may be performed, for example. Instead of the metal oxide film, a metal nitride or a metal oxynitride may be used. In this case, the metal film may be subjected to the plasma treatment or the heat treatment in a nitrogen atmosphere or an atmosphere of nitrogen and oxygen.

The semiconductor film 505 is formed to a thickness of 25 to 200 nm (preferably, 30 to 150 nm) by a sputtering method, an LPCVD method, a plasma CVD method, or the like.

Next, the semiconductor film 505 is crystallized by irradiation with laser light as shown in FIG. 7B. Note that the semiconductor film 505 may be crystallized by a method in which irradiation with laser light is combined with a thermal crystallization method using an RTA or an annealing furnace, or a thermal crystallization method using a metal element for promoting crystallization, or the like. After that, the obtained semiconductor film is etched so as to have a desired shape, thereby forming crystalline semiconductor films 505a to 505f. Then, a gate insulating film 506 is formed so as to cover the semiconductor films 505a to 505f.

The insulating film 506 is formed of an insulating material such as silicon oxide, silicon nitride, silicon oxynitride, or silicon nitride oxide, by a CVD method, a sputtering method, or the like. For example, in a case where the gate insulating film 506 has a two-layer structure, a silicon oxynitride film may be formed as a first insulating film and a silicon nitride oxide film may be formed as a second insulating film. Alternatively, a silicon oxide film may be formed as the first insulating film and a silicon nitride film may be formed as the second insulating film.

An example of a manufacturing step of the semiconductor films 505a to 505f is briefly described below. First, an amorphous semiconductor film with a thickness of 50 to 60 nm is formed by a plasma CVD method. Next, a solution containing nickel that is a metal element for promoting crystallization is retained on the amorphous semiconductor film, and dehydrogenation treatment (at 500° C., for one hour) and thermal crystallization treatment (at 550° C., for four hours) are performed to the amorphous semiconductor film, so that a crystalline semiconductor film is formed. After that, the crystalline semiconductor film is irradiated with laser light, and a photolithography method is used, so that the crystalline semiconductor films 505a to 505f are formed. Note that without being subjected to the thermal crystallization which uses the metal element for promoting crystallization, the amorphous semiconductor film may be crystallized only by irradiation with laser light.

As a laser oscillator used for crystallization, a continuous wave laser beam (a CW laser beam) or a pulsed wave laser beam (a pulsed laser beam) can be used. As a laser beam which can be used here, a laser beam emitted from one or more of the following can be used: a gas laser such as an Ar laser, a Kr laser, or an excimer laser; a laser of which medium is single crystalline YAG, YVO$_4$, forsterite (Mg$_2$SiO$_4$), YAlO$_3$, or GdVO$_4$, or polycrystalline (ceramic) YAG, Y$_2$O$_3$, YVO$_4$, YAlO$_3$, or GdVO$_4$, added with one or more of Nd, Yb, Cr, Ti, Ho, Er, Tm, and Ta as a dopant; a glass laser; a ruby laser; an alexandrite laser; a Ti:sapphire laser; a copper vapor laser; and a gold vapor laser. It is possible to obtain crystals with a large grain size when fundamental waves of such laser beams or second to fourth harmonics of the fundamental waves are used. For example, the second harmonic (532 nm) or the third harmonic (355 nm) of an Nd:YVO$_4$ laser (fundamental wave of 1064 nm) can be used. In this case, a power density of approximately 0.01 to 100 MW/cm$^2$ (preferably, 0.1 to 10 MW/cm$^2$) is necessary. Irradiation is conducted at a scanning rate of approximately 10 to 2000 cm/sec. It is to be noted that, a laser using, as a medium, single crystalline YAG, YVO$_4$, forsterite (Mg$_2$SiO$_4$), YAlO$_3$, or GdVO$_4$, or polycrystalline (ceramic) YAG, Y$_2$O$_3$, YVO$_4$, YAlO$_3$, or GdVO$_4$ added with one or more of Nd, Yb, Cr, Ti, Ho, Er, Tm, and Ta as a dopant; an Ar ion laser; or a Ti:sapphire laser can be continuously oscillated. Furthermore, pulse oscillation thereof can be performed at a repetition rate of 10 MHz or more by carrying out Q switch operation, mode locking, or the like. In a case where a laser beam is oscillated at a repetition rate of equal to or higher than 10 MHz, after a semiconductor film is melted by a laser and before it is solidified, the semiconductor film is irradiated with a next pulse. Therefore, unlike a case of using a pulsed laser with a low repetition rate, a solid-liquid interface can be continuously moved in the semiconductor film, so that crystal grains which continuously grow in a scanning direction can be obtained.

Alternatively, the gate insulating film 506 may be formed by performing the above high-density plasma treatment to the crystalline semiconductor films 505*a* to 505*f* to oxidize or nitride the surfaces thereof. For example, the gate insulating film 506 is formed by plasma treatment introducing a mixed gas of a rare gas such as He, Ar, Kr, or Xe and oxygen, nitrogen oxide (NO$_2$), ammonia, nitrogen, hydrogen, or the like. When excitation of the plasma in this case is performed by introduction of a microwave, plasma with a low electron temperature and high density can be generated. By an oxygen radical (there is a case where an OH radical is included) or a nitrogen radical (there is a case where an NH radical is included) generated by this high-density plasma, the surfaces of the semiconductor films can be oxidized or nitrided.

By treatment using such high-density plasma, an insulating film with a thickness of 1 to 20 nm, typically 5 to 10 nm, is formed over the semiconductor film. Since the reaction of this case is a solid-phase reaction, interface state density between the insulating film and the semiconductor film can be extremely low. Since such high-density plasma treatment oxidizes (or nitrides) a semiconductor film (crystalline silicon, or polycrystalline silicon) directly, unevenness of a thickness of the insulating film to be formed can be extremely small, ideally. In addition, oxidation is not strengthened even in a crystal grain boundary of crystalline silicon, which makes a very preferable condition. That is, by a solid-phase oxidation of the surface of the semiconductor film by the high-density plasma treatment shown here, an insulating film with good uniformity and low interface state density can be formed without abnormal oxidation reaction in a crystal grain boundary.

As the gate insulating film 506, an insulating film formed by the high-density plasma treatment may be used by itself, or an insulating film of silicon oxide, silicon oxynitride, silicon nitride, or the like may be formed thereover by a CVD method using plasma or thermal reaction, so as to make stacked layers. In any case, a transistor including an insulating film formed by high-density plasma, in a part of the gate insulating film or in the whole gate insulating film, can reduce variation in the characteristics.

Furthermore, a semiconductor film is irradiated with a continuous wave laser or a laser beam oscillated at a repetition rate of equal to or higher than 10 MHz and is scanned in one direction for crystallization, so that each of the semiconductor films 505*a* to 505*f* which has a characteristic that the crystal grows in the scanning direction of the beam is obtained. When a transistor is provided so that the scanning direction is aligned with the channel length direction (a direction in which carriers flow when a channel formation region is formed) and the above gate insulating layer is used, a thin film transistor (TFT) with less characteristic variation and high field effect mobility can be obtained.

Next, a first conductive film and a second conductive film are stacked over the gate insulating film 506. Here, the first conductive film is formed to a thickness of 20 to 100 nm by a CVD method, a sputtering method, or the like, and the second conductive film is formed to a thickness of 100 to 400 nm. The first conductive film and the second conductive film are formed using an element selected from tantalum (Ta), tungsten (W), titanium (Ti), molybdenum (Mo), aluminum (Al), copper (Cu), chromium (Cr), niobium (Nb), and the like, or an alloy material or a compound material containing the above elements as its main component. Alternatively, they are formed using a semiconductor material typified by polycrystalline silicon doped with an impurity element such as phosphorus. As examples of a combination of the first conductive film and the second conductive film, a tantalum nitride film and a tungsten film, a tungsten nitride film and a tungsten film, a molybdenum nitride film and a molybdenum film, and the like can be given. Since tungsten and tantalum nitride have high heat resistance, heat treatment for thermal activation can be performed after the first conductive film and the second conductive film are formed. In addition, in a case of a three-layer structure instead of a two-layer structure, a stacked layer structure of a molybdenum film, an aluminum film, and a molybdenum film is preferably adopted.

Next, a resist mask is formed by a photolithography method, and etching treatment for forming a gate electrode and a gate line is performed, so that gate electrodes 507 are formed above the semiconductor films 505*a* to 505*f*. Here, an example in which the gate electrode 507 has a stacked layer structure of a first conductive film 507*a* and a second conductive film 507*b* is shown.

Next, as shown in FIG. 7C, with the use of the gate electrode 507 as a mask, an impurity element imparting n-type conductivity is added to the semiconductor films 505*a* to 505*f* at low concentration by an ion doping method or an ion implantation method, and then, a resist mask is selectively formed by a photolithography method and an impurity element imparting p-type conductivity is added at high concentration. As an impurity element imparting n-type conductivity, phosphorus (P), arsenic (As), or the like can be used. As an impurity element imparting p-type conductivity, boron (B), aluminum (Al), gallium (Ga), or the like can be used. Here, phosphorus (P) is used for the impurity element imparting n-type conductivity, and is selectively introduced into the semiconductor films 505*a* to 505*f* at a concentration of $1 \times 10^{15}$ to $1 \times 10^{19}$/cm$^3$, so that an n-type impurity region 508 is formed. Further, boron (B) is used for the impurity element imparting p-type conductivity, and is selectively introduced into the semiconductor films 505*c* and 505*e* at a concentration of $1 \times 10^{19}$ to $1 \times 10^{20}$/cm$^3$, so that a p-type impurity region 509 is formed.

Next, an insulating film is formed so as to cover the gate insulating film 506 and the gate electrodes 507. The insulating film is formed as a single layer or stacked layers of a film including an inorganic material such as silicon, an oxide of silicon, or a nitride of silicon, or an organic material such as an organic resin, by a plasma CVD method, a sputtering method, or the like. Next, the insulating film is selectively etched by anisotropic etching which mainly etches in a perpendicular direction, so that insulating films 510 (also referred to as side walls) which are in contact with side surfaces of the gate electrodes 507 are formed. The insulating films 510 are used as masks for doping when LDD (lightly doped drain) regions are formed.

Next, with the use of a resist mask formed by a photolithography method, the gate electrodes 507, and the insulating films 510 as masks, an impurity element imparting n-type conductivity is added to the semiconductor films 505a, 505b, 505d, and 505f at high concentration, so that n-type impurity regions 511 are formed. Here, phosphorus (P) is used for the impurity element imparting n-type conductivity, and is selectively introduced into the semiconductor films 505a, 505b, 505d, and 505f at a concentration of $1 \times 10^{19}$ to $1 \times 10^{20}$/cm$^3$, so that the n-type impurity regions 511 with higher concentration than the n-type impurity regions 508 are formed.

Through aforementioned steps, as shown in FIG. 7D, n-channel thin film transistors 500a, 500b, 500d, and 500f, and p-channel thin film transistors 500c and 500e are formed. Note that the thin film transistors 500a to 500f are included in the semiconductor device of the present invention, such as an RFID. It is needless to say that each of thin film transistors formed in such a manner can be used as a thin film transistor included in the oscillator circuit of the present invention.

Note that in the n-channel thin film transistor 500a, a channel formation region is formed in a region of a semiconductor film 505a, which is overlapped with the gate electrode 507; the impurity region 511 forming a source region or a drain region is formed in a region which is not overlapped with the gate electrode 507 and the insulating film 510; and a lightly doped drain region (LDD region) is formed in a region which is overlapped with the insulating film 510 and is between the channel formation region and the impurity region 511. Similarly, in the n-channel thin film transistors 500b, 500d, and 500f, a channel formation region, a lightly doped drain region, and the impurity region 511 are formed.

In the p-channel thin film transistor 500c, a channel formation region is formed in a region of a semiconductor film 505c, which is overlapped with the gate electrode 507, and the impurity region 509 forming a source region or a drain region is formed in a region which is not overlapped with the gate electrode 507. Similarly, in the p-channel thin film transistor 500e, a channel formation region and an impurity region 509 are formed. Note that although each of the p-channel thin film transistors 500c and 500e is not provided with an LDD region here, a structure may be employed, in which each of the p-channel thin film transistors is provided with an LDD region or each of the n-channel thin film transistors is not provided with an LDD region.

Figure 8A:
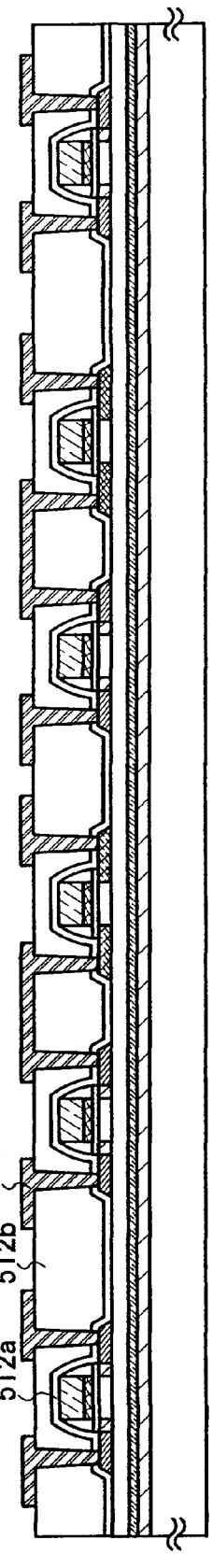
FIGS. 8A to 8C are partial cross-sectional views of a semiconductor device of the present invention.

Next, as shown in FIG. 8A, an insulating film is formed as a single layer or stacked layers so as to cover the semiconductor films 505a to 505f, the gate electrodes 507, and the like, so that conductive films 513 are formed over the insulating film, which are electrically connected to the impurity regions 509 and 511 for forming source regions or drain regions of the thin film transistors 500a to 500f. The insulating film is formed as a single layer or stacked layers using an inorganic material such as an oxide of silicon or a nitride of silicon, an organic material such as polyimide, polyamide, benzocyclobutene, acrylic, or epoxy, a siloxane material, or the like, by a CVD method, a sputtering method, an SOG method, a droplet discharging method, a screen printing method, or the like. Here, the insulating film is formed to have a two-layer structure. A silicon nitride oxide film is formed as a first insulating film 512a, and a silicon oxynitride film is formed as a second insulating film 512b. The conductive films 513 form the source electrodes or the drain electrodes of the thin film transistors 500a to 500f.

It is to be noted that before the insulating films 512a and 512b are formed or after one or more of thin films of the insulating films 512a and 512b are formed, heat treatment for recovering the crystallinity of the semiconductor film, for activating the impurity element which has been added to the semiconductor film, or for hydrogenating the semiconductor film is preferably performed. For the heat treatment, thermal annealing, a laser annealing method, an RTA method, or the like is preferably adopted.

The conductive film 513 is formed by a CVD method, a sputtering method, or the like to have a single-layer structure or a stacked-layer structure with the use of an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si), or an alloy material or a compound material containing any of the above elements as its main component. An alloy material containing aluminum as its main component corresponds to a material which contains aluminum as its main component and also contains nickel, or an alloy material which contains aluminum as its main component and also contains nickel and one or both of carbon and silicon, for example. The conductive film 513 may employ, for example, a stacked layer structure of a barrier film, an aluminum-silicon (Al—Si) film, and a barrier film, or a stacked layer structure of a barrier film, an aluminum-silicon (Al—Si) film, a titanium nitride film, and a barrier film. It is to be noted that a barrier film corresponds to a thin film formed by using titanium, a nitride of titanium, molybdenum, or a nitride of molybdenum. Aluminum and aluminum silicon which have low resistance and are inexpensive are optimal materials for forming the conductive film 513. In addition, generation of a hillock of aluminum or aluminum silicon can be prevented when upper and lower barrier layers are formed. Furthermore, when the barrier film is formed by using titanium that is a highly-reducible element, even if a thin natural oxide film is formed over the semiconductor film, the natural oxide film can be reduced so that preferable contact with the semiconductor film can be obtained.

Figure 8B:
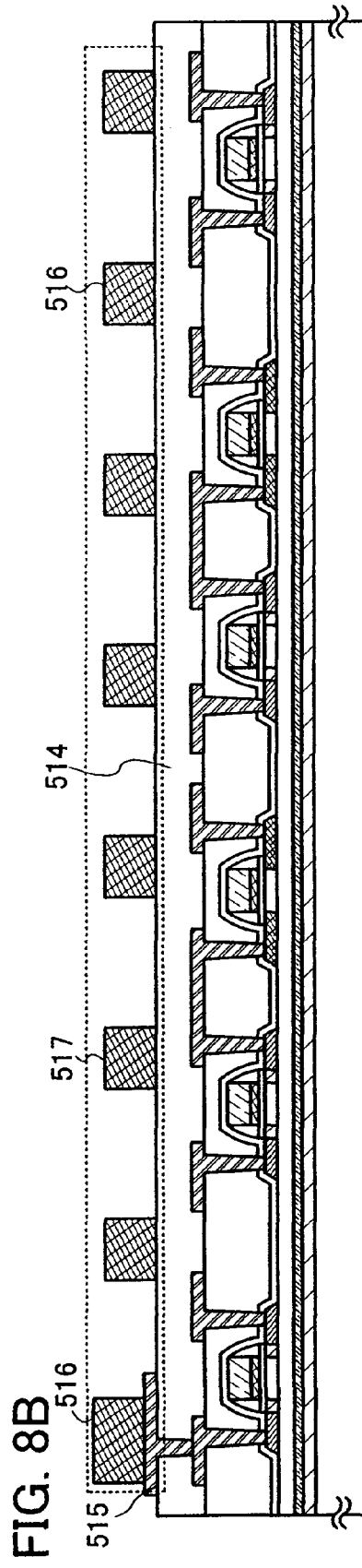

Next, an insulating film 514 is formed so as to cover the conductive films 513, and a conductive film 515 is formed over the insulating film 514 to be electrically connected to the conductive film 513 which forms a source electrode or a drain electrode of the thin film transistor. Note that FIG. 8B shows the conductive film 515 electrically connected to the conductive film 513 which forms a source electrode or a drain electrode of the thin film transistor 500a. Furthermore, the conductive film 515 can be formed using any of the materials given for the conductive films 513.

After that, as shown in FIG. 8B, a conductive film 516 functioning as an antenna is formed so as to be electrically connected to the conductive film 515.

The insulating film 514 can be formed by a CVD method, a sputtering method, or the like to have a single-layer structure or a stacked-layer structure of an insulating film containing oxygen or nitrogen, such as a silicon oxide film, a silicon nitride film, a silicon oxynitride film, and a silicon nitride oxide film; a film containing carbon such as DLC (Diamond Like Carbon); an organic material such as epoxy, polyimide, polyamide, polyvinylphenol, benzocyclobutene, or acrylic; or a siloxane material such as a siloxane resin. Note that the siloxane material is a material including a Si—O—Si bond. Siloxane is composed of a skeleton formed by the bond of silicon (Si) and oxygen (O), in which an organic group containing at least hydrogen (such as an alkyl group or an aryl group) is contained as a substituent. Alternatively, a fluoro group may be used as the substituent. Further alternatively, a fluoro group and an organic group containing at least hydrogen may be used as the substituent.

The conductive films 516 are formed using a conductive material by a CVD method, a sputtering method, a printing method such as screen printing or gravure printing, a droplet discharging method, a dispenser method, a plating method, or the like. The conductive material is formed to have a single-layer structure or a stacked-layer structure with the use of an element selected from aluminum (Al), titanium (Ti), silver (Ag), copper (Cu), gold (Au), platinum (Pt), nickel (Ni), palladium (Pd), tantalum (Ta), and molybdenum (Mo), or an alloy material or a compound material containing any of the above elements as its main component.

For example, in a case of forming the conductive films 516 functioning as the antennas by a screen printing method, the conductive films can be formed by being selectively printed with conductive paste in which conductive particles each having a grain size of several nm to several tens of μm are dissolved or dispersed in an organic resin. As the conductive particle, a fine particle or a dispersive nanoparticle of one or more metals of silver (Ag), gold (Au), copper (Cu), nickel (Ni), platinum (Pt), palladium (Pd), tantalum (Ta), molybdenum (Mo), and titanium (Ti) or silver halide can be used. As the organic resin included in the conductive paste, one or a plurality of organic resins each functioning as a binder, a solvent, a dispersant, or a coating of the metal particle can be used. Typically, an organic resin such as an epoxy resin or a silicone resin can be used. When forming a conductive film, baking is preferably performed after the conductive paste is applied. For example, in a case of using fine particles (of which grain size is 1 to 100 nm) containing silver as its main component as a material of the conductive paste, the conductive paste is hardened by being baked at a temperature of 150 to 300° C., and thus a conductive film can be obtained. Alternatively, fine particles containing solder or lead-free solder as its main component may be used; in this case, it is preferable to use a fine particle having a grain size of equal to or smaller than 20 μm. Solder and lead-free solder have an advantage such as low cost.

Figure 8C:
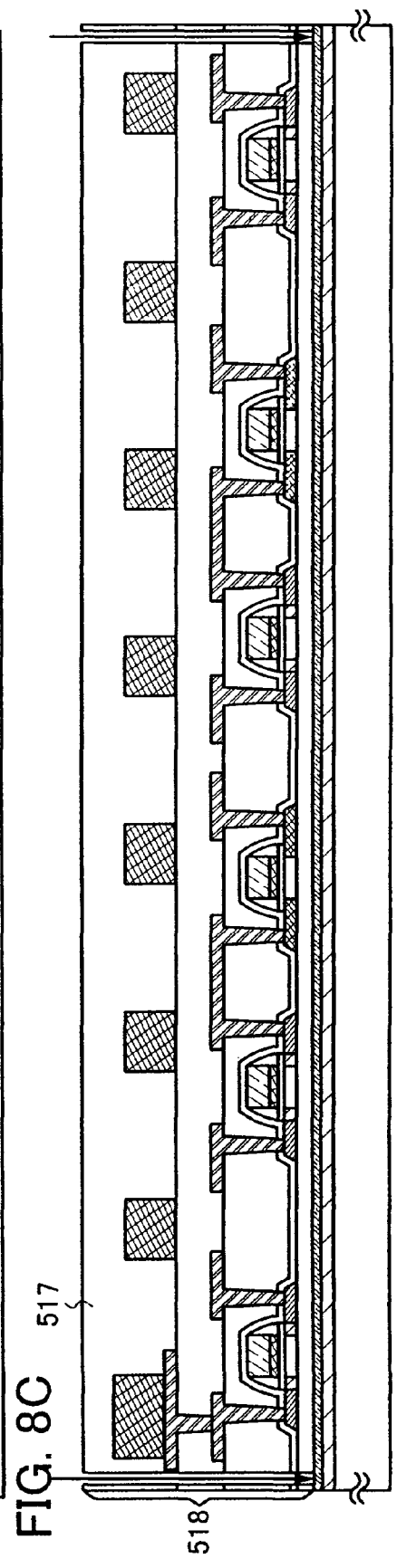

Next, as shown in FIG. 8C, after an insulating film 517 is formed so as to cover the conductive film 516, a layer including the thin film transistors 500a to 500f, the conductive films 516, and the like (hereinafter referred to as an "element formation layer 518") is released from the substrate 501. Here, openings are formed by laser light (such as UV light) irradiation in a region except portions in which the thin film transistors 500a to 500f are formed, and then, the element formation layer 518 can be released from the substrate 501 by using a physical force. Alternatively, an etchant may be introduced into the openings before the element formation layer 518 is released from the substrate 501 in order to selectively remove the release layer 503. As the etchant, gas or a liquid containing halogen fluoride or an interhalogen compound is used. For example, chlorine trifluoride ($ClF_3$) is used as gas containing halogen fluoride. Accordingly, the element formation layer 518 is released from the substrate 501. Note that the release layer 503 may be partially left instead of being removed entirely. Thus, consumption of the etchant can be reduced and process time for removing the release layer can be shortened. In addition, the element formation layer 518 can be retained over the substrate 501 even after the release layer 503 is removed. In addition, the substrate 501 is reused after the element formation layer 518 is released, whereby the cost can be reduced.

The insulating film 517 can be formed by a CVD method, a sputtering method, or the like to have a single-layer structure or a stacked-layer structure of an insulating film containing oxygen or nitrogen, such as a silicon oxide film, a silicon nitride film, a silicon oxynitride film, or a silicon nitride oxide film; a film containing carbon such as DLC (diamond like carbon); or an organic material such as epoxy, polyimide, polyamide, polyvinylphenol, benzocyclobutene, or acrylic; or a siloxane material such as a siloxane resin.

Figure 9A:
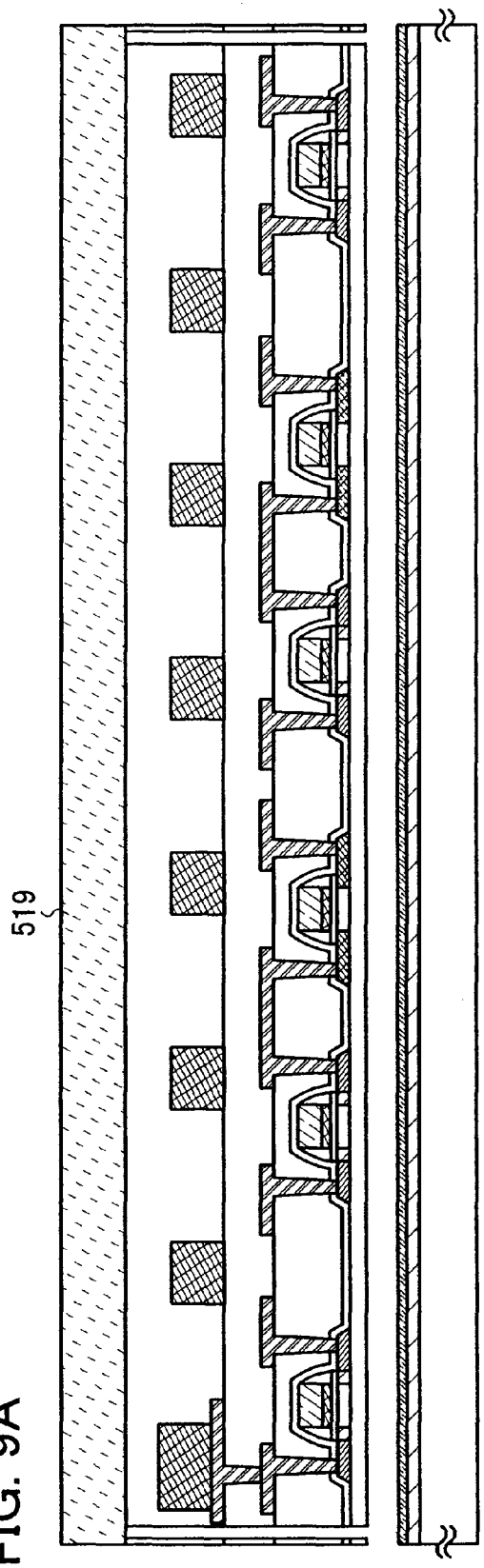
FIGS. 9A and 9B are partial cross-sectional views of a semiconductor device of the present invention.

In this embodiment mode, as shown in FIG. 9A, after an opening is formed in the element formation layer 518 by laser light irradiation, a first sheet material 519 is attached to one surface of the element formation layer 518 (a surface of the insulating film 517 that is exposed). Then, the element formation layer 518 is released from the substrate 501.

Figure 9B:
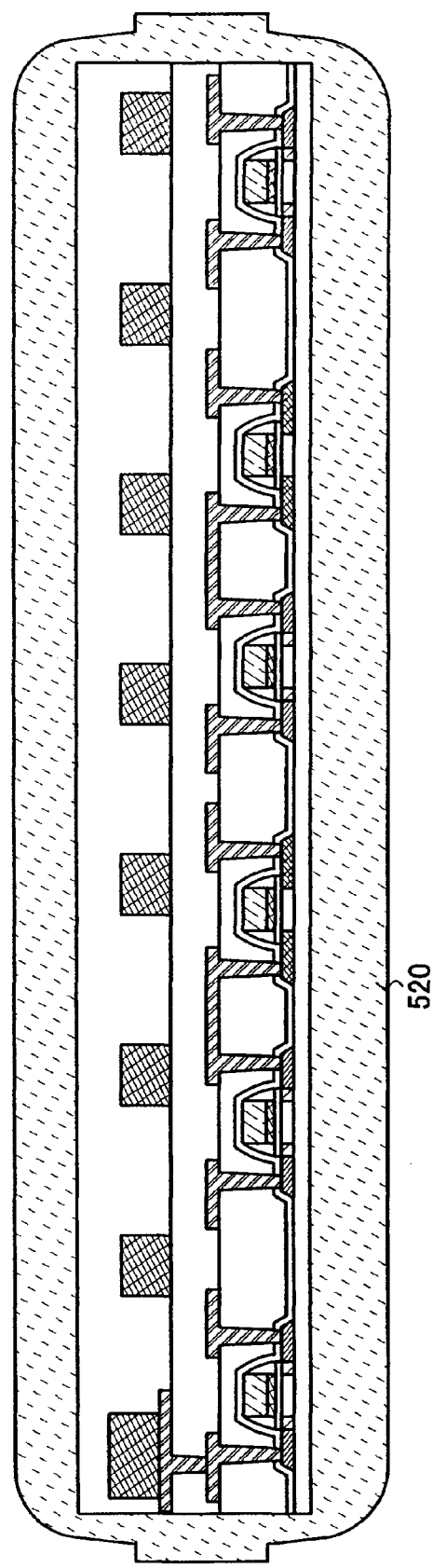

Next, as shown in FIG. 9B, a second sheet material 520 is attached to the other surface of the element formation layer 518 (a surface exposed by releasing) by one or both of heat treatment and pressure treatment. As the first sheet material 519 and the second sheet material 520, a hot-melt film or the like can be used.

As the first sheet material 519 and the second sheet material 520, a film to which an antistatic treatment for preventing static electricity or the like is performed (hereinafter referred to as an antistatic film) may be used. As the antistatic film, a film with an antistatic material dispersed in a resin, a film with an antistatic material attached thereto, and the like can be given as examples. The film provided with an antistatic material may be a film with an antistatic material provided over one of its surfaces, or a film with an antistatic material provided over each of its surfaces. As for the film with an antistatic material provided over one of its surfaces, the film may be attached to the layer so that the antistatic material is placed on the inner side of the film or the outer side of the film. Note that the antistatic material may be provided over an entire surface of the film, or over a part of the film. As the antistatic material here, a metal, indium tin oxide (ITO), or a surfactant such as an amphoteric surfactant, a cationic surfactant, or a nonionic surfactant can be used. Alternatively, as the antistatic material, a resin material containing cross-linked copolymer having a carboxyl group and a quaternary ammonium base on its side chain, or the like can be used. By attaching, mixing, or applying such a material to a film, an antistatic film can be formed. The sealing is performed using the antistatic film, and thus a semiconductor element can be prevented from being adversely affected due to static electricity from outside when dealt with as a product.

Through the above steps, the semiconductor device of the present invention can be manufactured. Note that in this embodiment mode, an example in which the antenna is provided over the same substrate as the thin film transistor is described; however, the present invention is not limited to this structure. A first substrate over which a layer having a thin film transistor and a second substrate over which a conductive layer functioning as an antenna may be attached with a resin containing conductive particles in order to electrically connect the thin film transistor and the antenna.

Note that in this embodiment mode, the process in which the element such as the thin film transistor is released after being formed over a substrate is shown. Alternatively, an element formed over a substrate may be used as a product without being released from the substrate. Further, after the element such as the thin film transistor is formed over a glass substrate, the glass substrate is polished from an opposite side of a surface over which the element is formed, so that reduction in film thickness and size of the semiconductor device can be achieved.

Note that this embodiment mode can be combined with any of the other embodiment modes in this specification as appropriate.

EMBODIMENT MODE 5

In this embodiment mode, a method for manufacturing a transistor included in the oscillator circuit or the semiconductor device of the present invention, which is different from that of the aforementioned embodiment mode, is described. The transistor in the oscillator circuit or the semiconductor device of the present invention can be formed of a MOS transistor on a single-crystalline substrate instead of the thin film transistor over an insulating substrate, which is described in the aforementioned embodiment mode.

In this embodiment mode, an example of a method for manufacturing a transistor included in the oscillator circuit or the semiconductor device of the present invention is described with reference to partial cross-sectional views shown in FIGS. 10A to 12.

First, separated element regions 902 and 903 (hereinafter also referred to as regions 902 and 903) are formed in a semiconductor substrate 900 as shown in FIG. 10A. The regions 902 and 903 provided in the semiconductor substrate 900 are separated from each other by an insulating film 901 (also referred to as a field oxide film). Note that here, an example is described in which an n-type single crystalline silicon substrate is used as the semiconductor substrate 900, and a p-well 904 is provided in the region 903 in the semiconductor substrate 900.

Any semiconductor substrate can be used as the semiconductor substrate 900. For example, a single crystalline silicon substrate having n-type or p-type conductivity, a compound semiconductor substrate (for example, a GaAs substrate, an InP substrate, a GaN substrate, a SiC substrate, a sapphire substrate, or a ZnSe substrate), an SOI (silicon on insulator) substrate manufactured by a bonding method or a SIMOX (separation by implanted oxygen) method, or the like can be used.

For the separated element regions 902 and 903, a selective oxidation method (LOCOS (local oxidation of silicon) method), a trench isolation method, or the like can be used as appropriate.

Furthermore, the p-well in the region 903 of the semiconductor substrate 900 can be formed by selective introduction of an impurity element imparting p-type conductivity into the semiconductor substrate 900. As the p-type impurity element, boron (B), aluminum (Al), gallium (Ga), or the like can be used.

Note that although an impurity element is not introduced into the region 902 because the n-type semiconductor substrate is used as the semiconductor substrate 900 in this embodiment mode, an n-well may be formed in the region 902 by introduction of an impurity element imparting n-type conductivity. As the impurity element imparting n-type conductivity, phosphorus (P), arsenic (As), or the like can be used. On the other hand, in the case where a p-type semiconductor substrate is used, an n-well may be formed in the region 902 by introduction of an impurity element imparting n-type conductivity and no impurity element may be introduced into the region 903.

Next, the insulating films 905 and 906 are formed so as to cover the regions 902 and 903 respectively (FIG. 10B)

The insulating films 905 and 906 can be formed of silicon oxide films by oxidizing surfaces of the regions 902 and 903 in the semiconductor substrate 900 respectively by heat treatment. Alternatively, the insulating films 905 and 906 can be formed to have a stacked-layer structure of a silicon oxide film and a silicon film containing oxygen and nitrogen (silicon oxynitride film) by forming the silicon oxide film using a thermal oxidation method and then nitriding the surface of the silicon oxide film by nitridation treatment.

Further alternatively, the insulating films 905 and 906 may be formed using plasma treatment. For example, by performing oxidation treatment or nitridation treatment with high-density plasma treatment to the surfaces of the regions 902 and 903 in the semiconductor substrate 900, silicon oxide films or silicon nitride films can be formed as the insulating films 905 and 906. Further, after oxidation treatment is performed to the surfaces of the regions 902 and 903 with high-density plasma treatment, nitridation treatment may be performed by performing high-density plasma treatment again. In this case, silicon oxide films are formed on surfaces of the regions 902 and 903, and silicon oxynitride films are formed on the silicon oxide films, so that each of the insulating films 905 and 906 has a stacked-layer structure of the silicon oxide film and the silicon oxynitride film. Further alternatively, after silicon oxide films are formed on surfaces of the regions 902 and 903 by a thermal oxidation method, oxidation treatment or nitridation treatment may be performed with high-density plasma treatment.

Note that the insulating films 905 and 906 function as gate insulating films in a transistor to be completed later.

Next, a conductive film is formed so as to cover the insulating films 905 and 906 formed over the regions 902 and 903 (FIG. 10C). Here, a conductive film 907 and a conductive film 908 are sequentially stacked as the conductive film. It is needless to say that the conductive film may be formed to have a single-layer structure or a staked-layer structure including three or more layers.

The conductive films 907 and 908 can be formed of an element selected from tantalum (Ta), tungsten (W), titanium (Ti), molybdenum (Mo), aluminum (Al), copper (Cu), chromium (Cr), niobium (Nb), and the like, or an alloy material or a compound material containing any of the above elements as a main component. Alternatively, a metal nitride film obtained by nitridation of any of the above elements can be used. Further alternatively, a semiconductor material typified by polycrystalline silicon doped with an impurity element such as phosphorus can be used.

Here, the conductive film is formed to have a stacked-layer structure by forming the conductive film 907 using tantalum nitride and forming the conductive film 908 using tungsten thereover. Alternatively, a single-layer or stacked-layer film of a tungsten nitride, a molybdenum nitride, or a titanium nitride can be used as the conductive film 907, and a single-layer or stacked-layer film of tantalum, molybdenum, or titanium can be used as the conductive film 908.

Figure 11A:
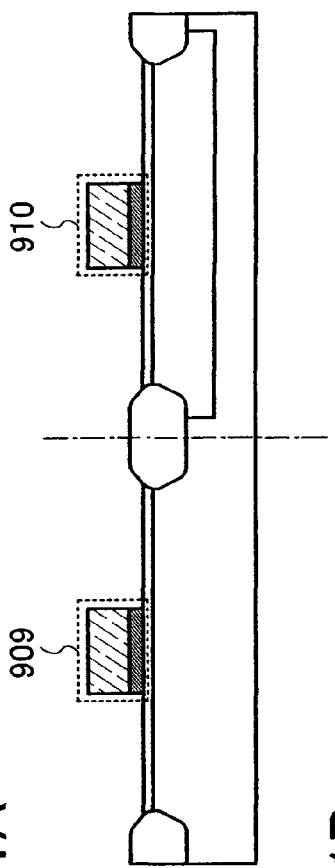
FIGS. 11A to 11C are partial cross-sectional views of transistors included in an oscillator circuit or a semiconductor device of the present invention.

Next, by selectively etching and removing the conductive films 907 and 908 which are stacked, the conductive films 907 and 908 are partially left over the regions 902 and 903 to form gate electrodes 909 and 910 as shown in FIG. 11A.

Figure 11B:
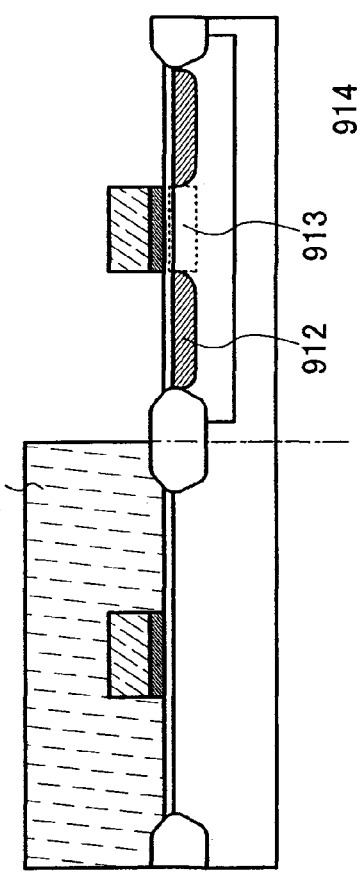

Next, a resist mask 911 is selectively formed so as to cover the region 902 and an impurity element is introduced into the region 903 by using the resist mask 911 and the gate electrode 910 as masks, so that impurity regions are formed (FIG. 11B). As the impurity element, an impurity element imparting n-type conductivity or an impurity element imparting p-type conductivity is used. As the impurity element imparting n-type conductivity, phosphorus (P), arsenic (As), or the like can be used. As the impurity element imparting p-type conductivity, boron (B), aluminum (Al), gallium (Ga), or the like can be used. Here, phosphorus (P) is used as the impurity element.

By introducing the impurity element, an impurity region 912 forming a source region or a drain region and a channel formation region 913 are formed in the region 903 as shown in FIG. 11B.

Figure 11C:
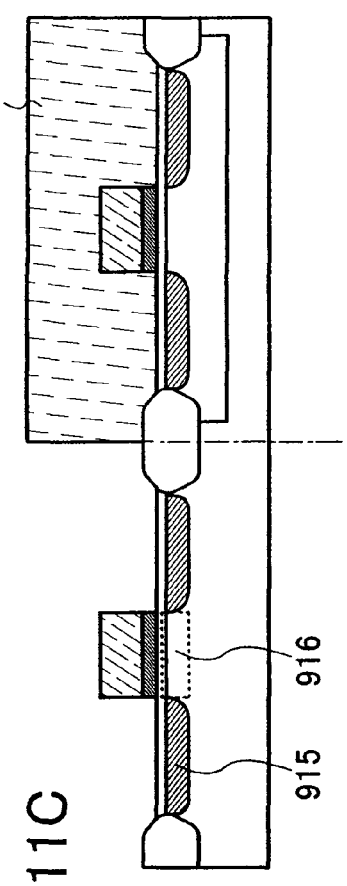

Next, a resist mask 914 is selectively formed so as to cover the region 903, and an impurity element is introduced into the region 902 with the use of the resist mask 914 and the gate electrode 909 as masks, so that an impurity region is formed (FIG. 11C). As the impurity element, an impurity element imparting n-type conductivity or an impurity element imparting p-type conductivity is used. As the impurity element imparting n-type conductivity, phosphorus (P), arsenic (As), or the like can be used. As the impurity element imparting p-type conductivity, boron (B), aluminum (Al), gallium (Ga), or the like can be used. Here, an impurity element having a conductivity type which is different from that of the impurity element introduced into the region 903 in FIG. 11B (for example, boron (B)) is introduced. As a result, an impurity region 915 forming a source region or a drain region and a channel formation region 916 are formed in the region 902.

Figure 12:
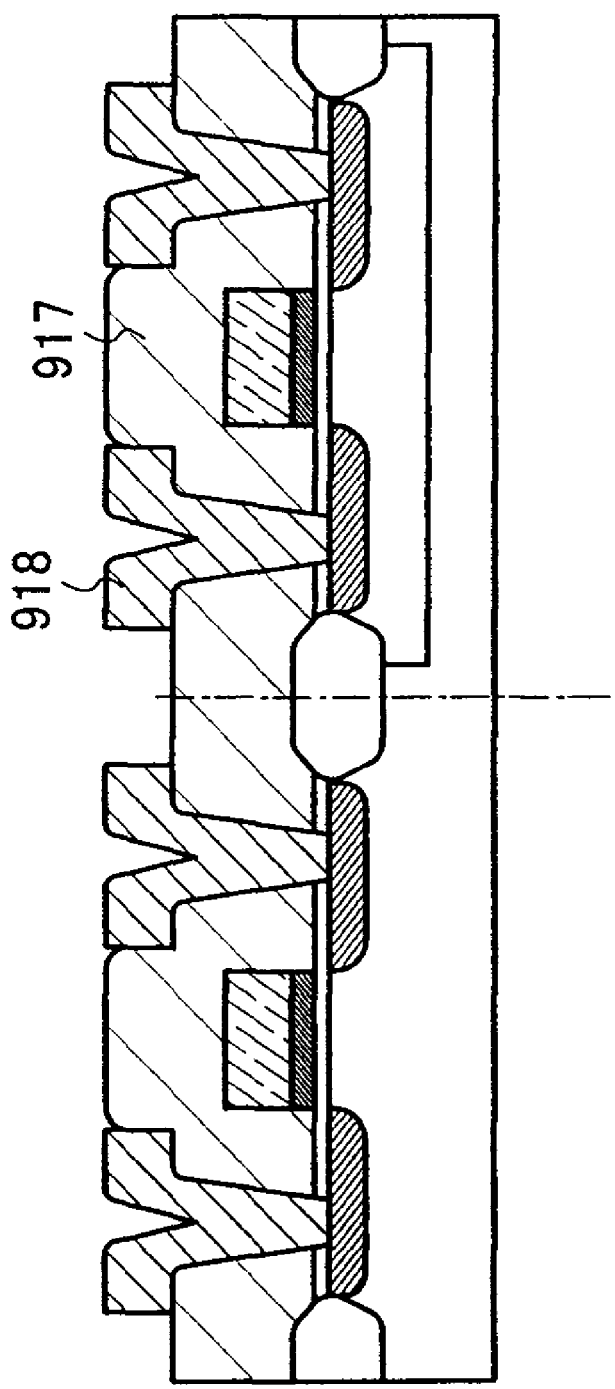
FIG. 12 is a partial cross-sectional view of transistors included in an oscillator circuit or a semiconductor device of the present invention.

Next, a second insulating film 917 is formed so as to cover the insulating films 905 and 906 and the gate electrodes 909 and 910; and over the second insulating film 917, a wiring 918 is formed to be electrically connected to the impurity regions 912 and 915 formed in the regions 902 and 903 respectively (FIG. 12).

The second insulating film 917 can be formed by a CVD method, a sputtering method, or the like to have a single-layer structure or a stacked-layer structure of an insulating film containing oxygen or nitrogen, such as a silicon oxide film, a silicon nitride film, a silicon oxynitride film, or a silicon nitride oxide film; a film containing carbon such as DLC (diamond like carbon); an organic material such as epoxy, polyimide, polyamide, polyvinylphenol, benzocyclobutene, or acrylic; or a siloxane material such as a siloxane resin. Note that the siloxane material is a material including a Si—O—Si bond. Siloxane is composed of a skeleton formed by the bond of silicon (Si) and oxygen (O), in which an organic group containing at least hydrogen (such as an alkyl group or an aryl group) is contained as a substituent. Alternatively, a fluoro group may be used as the substituent. Further alternatively, a fluoro group and an organic group containing at least hydrogen may be used as the substituent.

The wiring 918 is formed by a CVD method, a sputtering method, or the like to have a single-layer structure or a stacked-layer structure with the use of an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si), or an alloy material or a compound material containing any of the above elements as its main component. An alloy material containing aluminum as its main component corresponds to a material which contains aluminum as its main component and also contains nickel, or an alloy material which contains aluminum as its main component and also contains nickel and one or both of carbon and silicon, for example. The wiring 918 preferably employs, for example, a stacked layer structure of a barrier film, an aluminum-silicon (Al—Si) film, and a barrier film, or a stacked-layer structure of a barrier film, an aluminum-silicon (Al—Si) film, a titanium nitride film, and a barrier film. It is to be noted that a barrier film corresponds to a thin film formed by using titanium, a nitride of titanium, molybdenum, or a nitride of molybdenum. Aluminum and aluminum silicon which have low resistance and are inexpensive are optimal materials for forming the wiring 918. In addition, generation of a hillock of aluminum or aluminum silicon can be prevented when upper and lower barrier layers are formed. Furthermore, when the barrier film is formed by using titanium that is a highly-reducible element, even if a thin natural oxide film is formed over the crystalline semiconductor film, the natural oxide film can be reduced so that preferable contact with the crystalline semiconductor film can be obtained.

Thus, a MOS transistor can be manufactured using a single-crystalline substrate. Note that a structure of the transistor is not limited to the abovementioned structure. For example, an inversely staggered structure, a FinFET structure, or the like may be employed. Note also that with the FinFET structure, a short-channel effect associated with miniaturization of a size of a transistor can be suppressed.

Further, this embodiment mode can be combined with any of the other embodiment modes in this specification as appropriate.

EMBODIMENT MODE 6

In this embodiment mode, a method for manufacturing a transistor included in the oscillator circuit or the semiconductor device of the present invention, which is different from that of the aforementioned embodiment mode, is described. The transistor in the oscillator circuit or the semiconductor device of the present invention may be formed of a MOS transistor provided by a manufacturing method different from that of the MOS transistor on the single crystalline substrate, which is described in the aforementioned embodiment mode.

In this embodiment mode, an example of a method for manufacturing a transistor included in the oscillator circuit or the semiconductor device of the present invention is described with reference to partial cross-sectional views shown in FIGS. 13A to 16B.

Figure 13A:
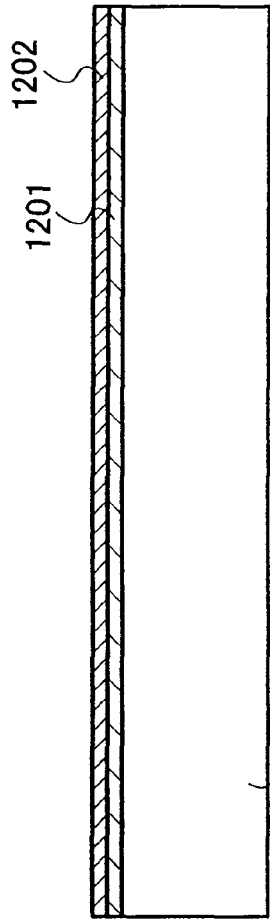
FIGS. 13A to 13C are partial cross-sectional views of transistors included in an oscillator circuit or a semiconductor device of the present invention.

First, an insulating film is formed over a substrate 1200 as shown in FIG. 13A. Here, n-type single crystalline silicon is used for the substrate 1200, and an insulating film 1201 and an insulating film 1202 are formed over the substrate 1200. For example, silicon oxide is used for the insulating film 1201 by performing heat treatment to the substrate 1200, and silicon nitride is formed over the insulating film 1201 by a CVD method.

Any semiconductor substrate can be used as the substrate 1200. For example, an n-type or p-type single crystalline silicon substrate, a compound semiconductor substrate (for example, a GaAs substrate, an InP substrate, a GaN substrate, an SiC substrate, a sapphire substrate, or a ZnSe substrate), an SOI (silicon on insulator) substrate manufactured by a bonding method or a SIMOX (separation by implanted oxygen) method, or the like can be used.

Further, the insulating film 1202 may be provided by nitridation of the insulating film 1201 by high-density plasma treatment after formation of the insulating film 1201. Note that the insulating film to be provided over the substrate 1200 may be formed to have a single-layer structure or a staked-layer structure including three or more layers.

Figure 13B:
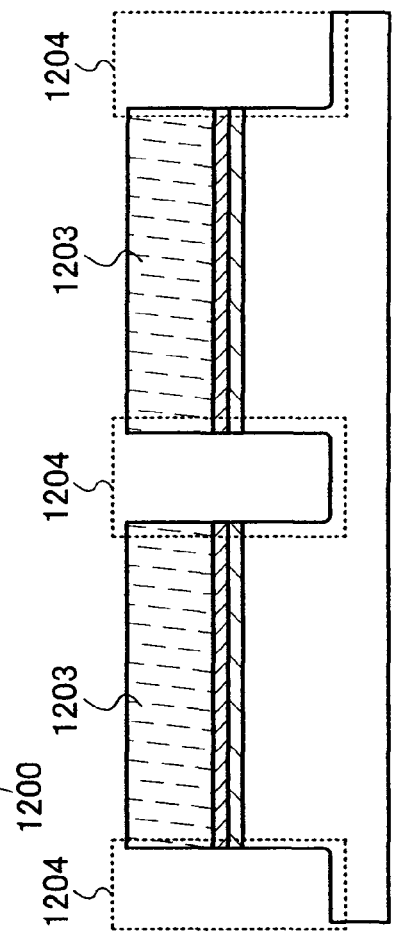

Next, as shown in FIG. 13B, patterns of resist masks 1203 are selectively formed over the insulating film 1202, and etching is selectively performed using the resist masks 1203 as masks, so that depressions 1204 are selectively formed in the substrate 1200. Etching of the substrate 1200 and the insulating films 1201 and 1202 can be performed by dry etching utilizing plasma.

Figure 13C:
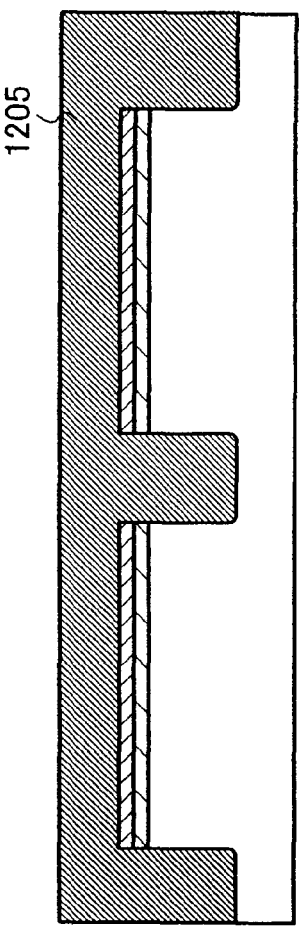

Next, as shown in FIG. 13C, after the pattern of the resist mask 1203 is removed, an insulating film 1205 is formed so as to fill the depressions 1204 formed in the substrate 1200.

The insulating film 1205 is formed using an insulating material such as silicon oxide, silicon nitride, silicon oxynitride, or silicon nitride oxide by a CVD method, a sputtering method, or the like. Here, a silicon oxide film is formed as the insulating film 1205 with the use of a TEOS (tetraethoxysilane) gas by a normal-pressure CVD method or a low-pressure CVD method.

Figure 14A:
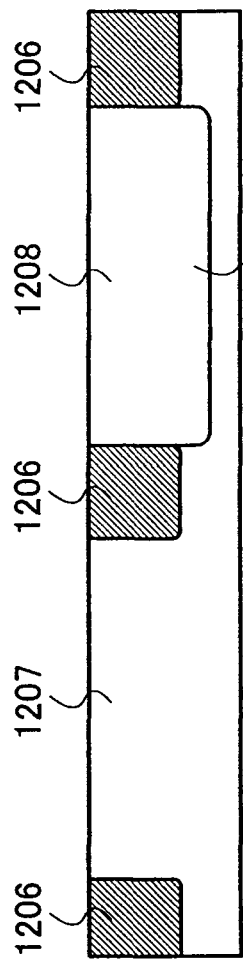
FIGS. 14A to 14C are partial cross-sectional views of transistors included in an oscillator circuit or a semiconductor device of the present invention.

Next, as shown in FIG. 14A, a surface of the substrate 1200 is exposed by performing grinding treatment, polishing treatment, or CMP (chemical mechanical polishing) treatment. Here, when the surface of the substrate 1200 is exposed, regions 1207 and 1208 are each provided between insulating films 1206 formed in the depressions 1204 of the substrate 1200. Note that the insulating films 1206 are formed by removing the insulating film 1205 formed over the surface of the substrate 1200, by grinding treatment, polishing treatment, or CMP treatment. Then, an impurity element imparting p-type conductivity is selectively introduced, so that a p-well 1209 is formed in the region 1208.

As the impurity element imparting p-type conductivity, boron (B), aluminum (Al), gallium (Ga), or the like can be used. Here, boron (B) is introduced into the region 1208 as the impurity element.

Note that although an impurity element is not introduced into the region 1207 because the n-type semiconductor substrate is used as the substrate 1200 in this embodiment mode, an n-well may be formed in the region 1207 by introduction of an impurity element imparting n-type conductivity. As the impurity element imparting n-type conductivity, phosphorus (P), arsenic (As), or the like can be used.

On the other hand, in the case where a p-type semiconductor substrate is used, an impurity element imparting n-type conductivity may be introduced only into the region 1207 so as to form an n-well, not into the region 1208.

Figure 14B:
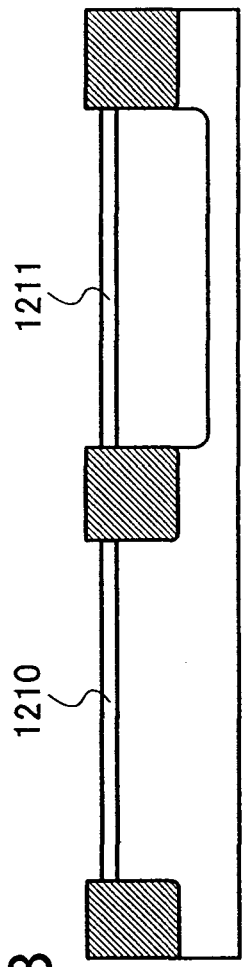

Next, as shown in FIG. 14B, insulating films 1210 and 1211 are formed on the surfaces of the regions 1207 and 1208 in the substrate 1200, respectively.

Each of the insulating films 1210 and 1211 can be formed of a silicon oxide film by oxidizing the surfaces of the regions 1207 and 1208 in the substrate 1200 by heat treatment. Alternatively, each of the first insulating films 1210 and 1211 can be formed to have a stacked-layer structure of a silicon oxide film and a film containing oxygen and nitrogen (silicon oxynitride film) by forming the silicon oxide film by a thermal oxidation method and then nitriding the surface of the silicon oxide film by nitridation treatment.

Further alternatively, as described above, the insulating films 1210 and 1211 may be formed using plasma treatment. For example, oxidation treatment or nitridation treatment is performed by high-density plasma treatment to the surfaces of the regions 1207 and 1208 provided in the substrate 1200, so that silicon oxide ($SiO_x$) films or silicon nitride ($SiN_x$) films can be formed as the insulating films 1210 and 1211. Alternatively, after oxidation treatment is performed to the surfaces of the regions 1207 and 1208 by high-density plasma treatment, high-density plasma treatment may be performed again to perform nitridation treatment. In this case, silicon oxide films are formed on the surfaces of the regions 1207 and 1208, and silicon oxynitride films are formed over the silicon oxide films, so that each of the insulating films 1210 and 1211 is formed as a film having a stacked-layer structure of the silicon oxide film and the silicon oxynitride film. Further alternatively, after silicon oxide films are formed on the surfaces of the regions 1207 and 1208 by a thermal oxidation method, oxidation treatment or nitridation treatment may be performed by high-density plasma treatment.

Note that the insulating films 1210 and 1211 formed over the regions 1207 and 1208 in the substrate 1200 function as gate insulating films in a transistor to be completed later.

Figure 14C:
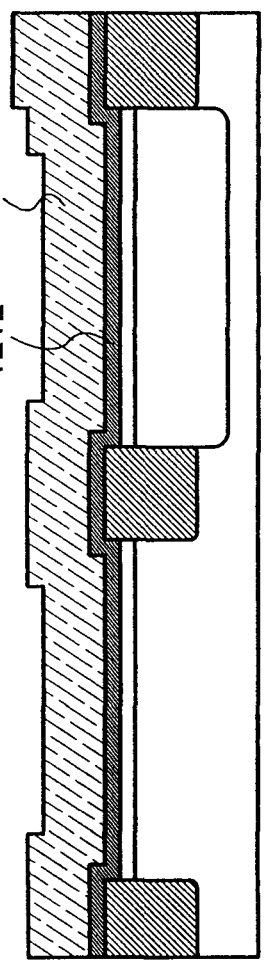

Next, as shown in FIG. 14C, a conductive film is formed so as to cover the insulating films 1210 and 1211 formed over the regions 1207 and 1208 provided in the substrate 1200. Here, a conductive film 1212 and a conductive film 1213 are sequentially stacked as the conductive film. It is needless to say that the conductive film may be formed to have a single-layer structure or a staked-layer structure including three or more layers.

The conductive films 1212 and 1213 can be formed of an element selected from tantalum (Ta), tungsten (W), titanium (Ti), molybdenum (Mo), aluminum (Al), copper (Cu), chromium (Cr), niobium (Nb), and the like, or an alloy material or a compound material containing any of the above elements as a main component. Alternatively, a metal nitride film obtained by nitridation of the element may be used. Further alternatively, a semiconductor material typified by polycrystalline silicon doped with an impurity element such as phosphorus may be used.

Here, the conductive film is formed to have a stacked-layer structure by formation of the conductive film 1212 using tantalum nitride and formation of the conductive film 1213 using tungsten thereover. Alternatively, a single-layer or stacked-layer film of tantalum nitride, tungsten nitride, molybdenum nitride, or titanium nitride can be used as the conductive film 1212, and a single-layer or stacked-layer film of tungsten, tantalum, molybdenum, or titanium can be used as the conductive film 1213.

Figure 15A:
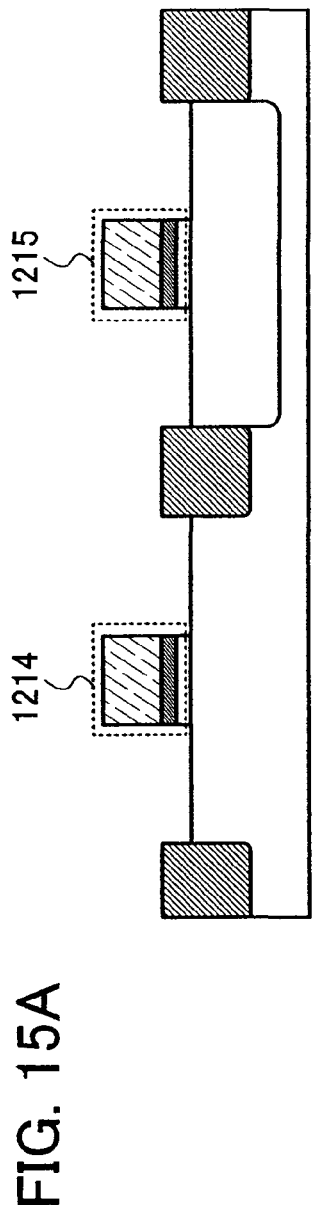
FIGS. 15A to 15C are partial cross-sectional views of transistors included in an oscillator circuit or a semiconductor device of the present invention.

Next, as shown in FIG. 15A, by selectively etching and removing the conductive films 1212 and 1213 which are stacked, the conductive films 1212 and 1213 are partially left over the regions 1207 and 1208 in the substrate 1200 to form conductive films 1214 and 1215 each functioning as a gate electrode. In addition, here, surfaces of parts of the regions 1207 and 1208 which are not overlapped with the conductive films 1214 and 1215 are exposed in the substrate 1200.

Specifically, in the region 1207 in the substrate 1200, a part of the insulating film 1210 formed below the conductive film 1214, which is not overlapped with the conductive film 1214, is selectively removed so that ends of the conductive film 1214 and the insulating film 1210 are roughly aligned with each other. In the region 1208 in the substrate 1200, a part of the insulating film 1211 formed below the conductive film 1215, which is not overlapped with the conductive film 1215, is selectively removed so that ends of the conductive film 1215 and the insulating film 1211 are roughly aligned with each other.

In this case, parts of the insulating films and the like which are not overlapped with the conductive films 1214 and 1215 may be removed at the same time as the formation of the conductive films 1214 and 1215; or may be removed after formation of the conductive films 1214 and 1215, by using the remaining resist or the conductive films 1214 and 1215 as masks.

Figure 15B:
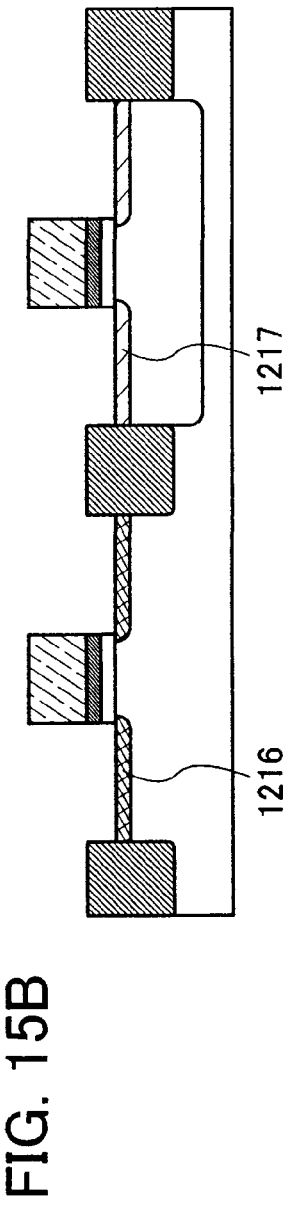

Next, as shown in FIG. 15B, an impurity element is selectively introduced into the regions 1207 and 1208 in the substrate 1200. Here, an impurity element imparting n-type conductivity is selectively introduced into the region 1208 at low concentration with the use of the conductive film 1215 as a mask to form an impurity region 1217. On the other hand, an impurity element imparting p-type conductivity is selectively introduced into the region 1207 at low concentration with the use of the conductive film 1214 as a mask to form an impurity region 1216. As the impurity element imparting n-type conductivity, phosphorus (P), arsenic (As), or the like can be used. As the impurity element imparting p-type conductivity, boron (B), aluminum (Al), gallium (Ga), or the like can be used.

Next, sidewalls 1218 are formed in contact with side surfaces of the conductive films 1214 and 1215. Specifically, a film including an inorganic material such as silicon, an oxide of silicon, or a nitride of silicon, or a film including an organic material such as an organic resin is formed to have a single-layer structure or a stacked-layer structure by a plasma CVD method, a sputtering method, or the like. Then, the insulating film is selectively etched by anisotropic etching mainly in the perpendicular direction, such that the insulating film is formed in contact with the side surfaces of the conductive films 1214 and 1215. Note that the sidewalls 1218 are used as masks for doping when LDD (lightly doped drain) regions are formed. Further, here, the sidewalls 1218 are formed in contact with side surfaces of insulating films and floating gate electrodes formed below the conductive films 1214 and 1215 as well.

Figure 15C:
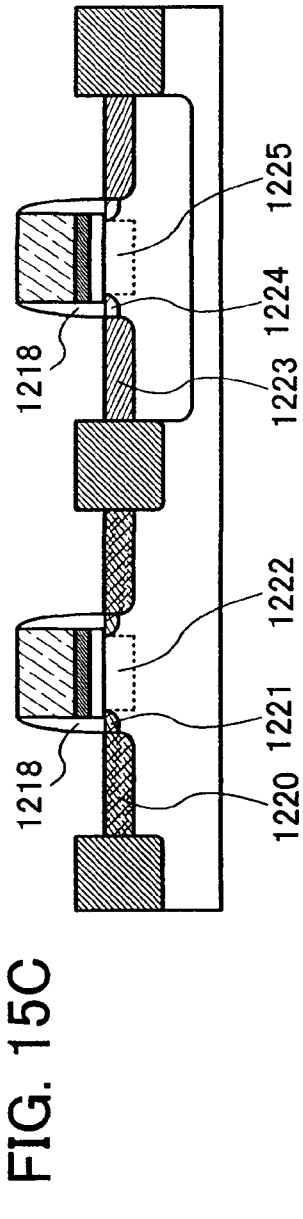

Subsequently, as shown in FIG. 15C, an impurity element is introduced into the regions 1207 and 1208 in the substrate 1200 with the use of the sidewalls 1218 and the conductive films 1214 and 1215 as masks, so that impurity regions functioning as source regions or drain regions are formed. Here, an impurity element imparting n-type conductivity is introduced into the region 1208 in the substrate 1200 at high concentration with the use of the sidewalls 1218 and the conductive film 1215 as masks, while an impurity element imparting p-type conductivity is introduced into the region 1207 at high concentration with the use of the sidewalls 1218 and the conductive film 1214 as masks.

As a result, in the region 1207 in the substrate 1200, impurity regions 1220 forming source and drain regions, low-concentration impurity regions 1221 forming LDD regions, and a channel formation region 1222 are formed. In the region 1208 in the substrate 1200, impurity regions 1223 forming source and drain regions, low-concentration impurity regions 1224 forming LDD regions, and a channel formation region 1225 are formed.

Note that in this embodiment mode, introduction of the impurity element is performed under a condition in which the parts of the regions 1207 and 1208 in the substrate 1200, which are not overlapped with the conductive films 1214 and 1215, are exposed. Therefore, the channel formation regions 1222 and 1225 formed in the regions 1207 and 1208 in the substrate 1200 respectively can be formed in a self-aligned manner with the conductive films 1214 and 1215.

Figure 16A:
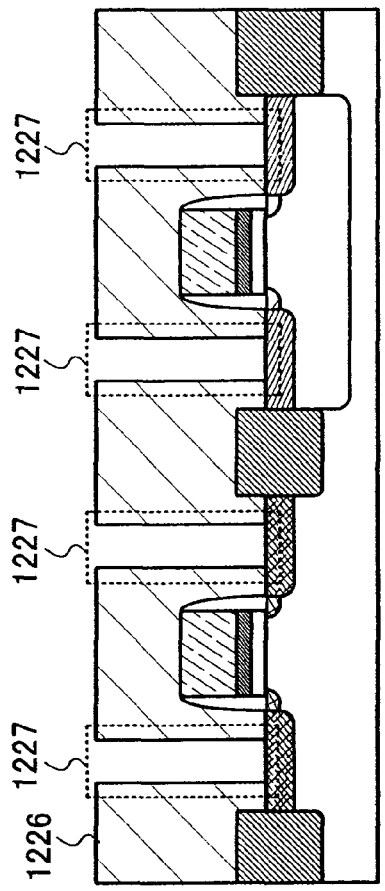
FIGS. 16A and 16B are partial cross-sectional views of transistors included in an oscillator circuit or a semiconductor device of the present invention.

Next, a second insulating film 1226 is formed so as to cover the insulating films, the conductive films, or the like provided over the regions 1207 and 1208 in the substrate 1200, and openings 1227 are formed in the insulating film 1226 (FIG. 16A).

The second insulating film 1226 can be formed by a CVD method, a sputtering method, or the like to have a single-layer structure or a stacked-layer structure of an insulating film containing oxygen or nitrogen, such as silicon oxide, silicon nitride, silicon oxynitride, or silicon nitride oxide; a film containing carbon such as DLC (Diamond Like Carbon); an organic material such as epoxy, polyimide, polyamide, polyvinyl phenol, benzocyclobutene, or acrylic; or a siloxane material such as a siloxane resin. Note that the siloxane material is a material including a Si—O—Si bond. Siloxane has a skeleton structure containing a bond of silicon (Si) and oxygen (O). As a substituent, an organic group containing at least hydrogen (for example, an alkyl group or an aryl group) can be used. Alternatively, a fluoro group may be used as the substituent. Further alternatively, as the substituent, an organic group containing at least hydrogen and a fluoro group may be used.

Figure 16B:
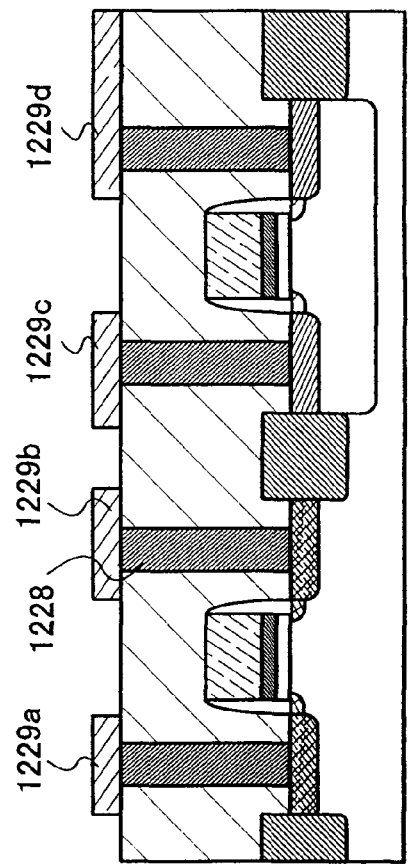

Next, conductive films 1228 are formed in the openings 1227 by a CVD method, and conductive films 1229a to 1229d are selectively formed over the insulating film 1226 so as to be electrically connected to the conductive films 1228 (FIG. 16B).

Each of the conductive films 1228, and 1229a to 1229d is formed by a CVD method, a sputtering method, or the like to have a single-layer structure or a stacked-layer structure with the use of an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si), or an alloy material or a compound material containing any of the above elements as a main component. An alloy material containing aluminum as its main component corresponds to a material which contains aluminum as its main component and also contains nickel, or an alloy material which contains aluminum as its main component and also contains nickel and one or both of carbon and silicon, for example. Each of the conductive films 1228, and 1229a to 1229d preferably employ, for example, a stacked layer structure of a barrier film, an aluminum-silicon (Al—Si) film, and a barrier film, or a stacked layer structure of a barrier film, an aluminum-silicon (Al—Si) film, a titanium nitride film, and a barrier film. It is to be noted that a barrier film corresponds to a thin film formed by using titanium, a nitride of titanium, molybdenum, or a nitride of molybdenum. Aluminum and aluminum silicon which have low resistance and are inexpensive are optimal materials for forming the conductive film 1228. In addition, generation of a hillock of aluminum or aluminum silicon can be prevented when upper and lower barrier layers are formed. Furthermore, when the barrier film is formed using titanium that is a highly-reducible element, even if a thin natural oxide film is formed over the crystalline semiconductor film, the natural oxide film is reduced so that preferable contact with the crystalline semiconductor film can be obtained. Here, each of the conductive films 1228 can be formed by selective growth of tungsten (W) by a CVD method.

Through the above steps, an oscillator circuit or a semiconductor device which is provided with a p-channel transistor formed in the region 1207 and an n-channel transistor formed in the region 1208 in the substrate 1200 can be obtained.

Note that a structure of the transistor is not limited to the abovementioned structure. For example, an inversely staggered structure, a FinFET structure, or the like may be employed. Note also that with the FinFET structure, a short-channel effect associated with miniaturization of a size of a transistor can be suppressed.

Further, this embodiment mode can be combined with any of the other embodiment modes in this specification as appropriate.

EMBODIMENT MODE 7

In this embodiment mode, uses of a semiconductor device of the present invention, such as an RFID, is described. A semiconductor device of the present invention can be used as a so-called ID label, ID tag, or ID card provided in, for example, bills, coins, securities, bearer bonds, documents (such as driver's licenses or resident's cards), packaging containers (such as wrapping paper or bottles), storage media (such as DVD software or video tapes), vehicles (such as bicycles), personal belongings (such as bags or glasses), foods, plants, animals, human bodies, clothing, everyday articles, or tags on products such as an electronic appliances or on packs. Electronic appliances refer to a liquid crystal display device, an EL display device, a television set (also called a TV set simply, a TV receiver, or a television receiver), a mobile phone, and the like. As for an RFID, a value of a power supply voltage to be obtained fluctuates easily in accordance with a distance from a reader/writer, or the like; however, by using the oscillator circuit of the present invention, it is possible to suppress a change in a clock signal due to a value of power supply voltage and to generate a stable clock even when the value of power supply voltage fluctuates. Accordingly, a semiconductor device which is highly reliable and can transmit and receive data wirelessly can be obtained.

In this embodiment, an application of the present invention and an example of a product with the semiconductor device of the present invention are described with reference to FIGS. 17A to 17E.

Figure 17A:
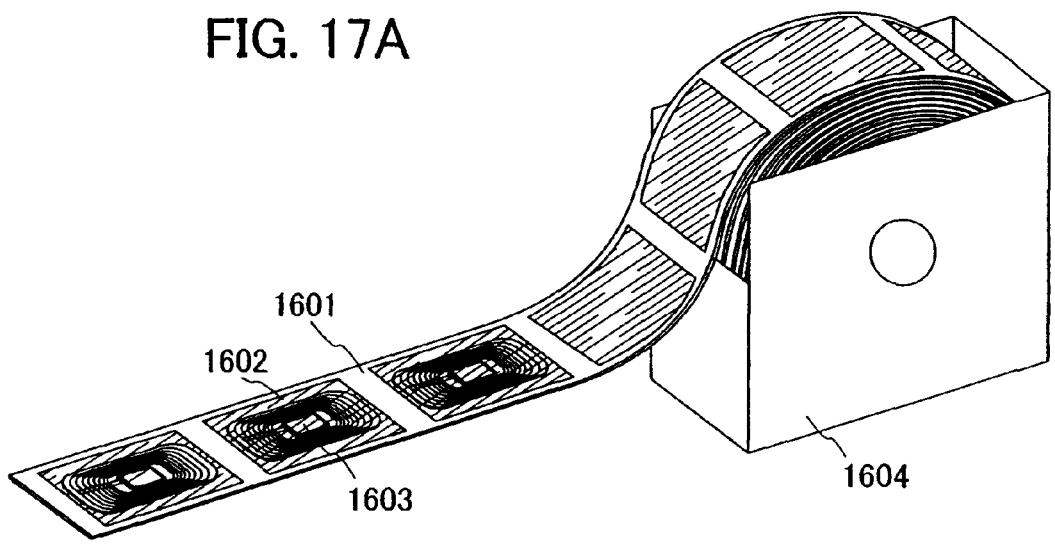
FIGS. 17A to 17E are views each showing an example of an article according to the present invention.

FIG. 17A shows an example of a state of completed products of a semiconductor device including the RFID of the present invention. A plurality of ID labels 1603 each incorporating an RFID 1602 is formed on a label board 1601 (separate paper). The ID labels 1603 are put in a box 1604. On the ID label 1603, information on a product or service (for example, a name of the product, a brand, a trademark, a trademark owner, a seller, a manufacturer, and the like) is written. In addition, an ID number which is specific to the product (or the kind of the product) is assigned to the incorporated RFID, so that forgery, infringement of intellectual property rights such as a trademark and a patent, and illegality such as unfair competition can be figured out. Further, a lot of information which is too much to be written clearly on a container or a label of the product, for example, production area, selling area, quality, raw material, efficacy, use, quantity, shape, price, production method, directions for use, production time, time of the use, expiration date, instructions of the product, information on the intellectual property of the product, and the like can be inputted in the RFID; therefore, a trader and a consumer can access the information with the use of a simple reader. The producer can also easily carry out rewriting or deleting of the information, while the trader and the consumer are not allowed to carry out rewriting or deleting of the information.

Figure 17B:
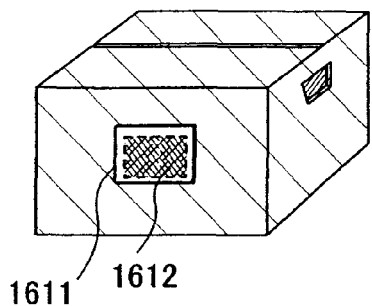

FIG. 17B shows an ID tag 1611 with a label shape, in which an RFID 1612 is incorporated. Mounting the ID tag 1611 on a product allows the product to be managed easily. For example, when the product is stolen, the thief can be figured out quickly by tracing of the pathway of the product. Thus, products which are superior in so-called traceability can be distributed by being provided with the ID tags.

Figure 17C:
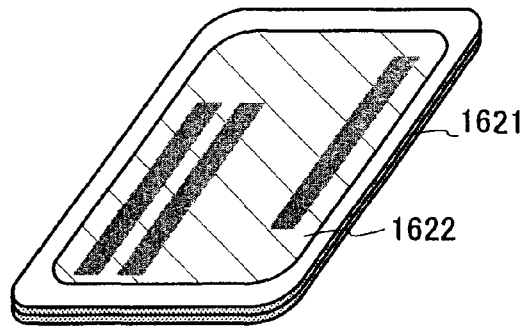

FIG. 17C shows an example of a state of a completed product of an ID card 1621 including an RFID 1622 of the present invention. The ID card 1621 includes all kinds of cards such as a cash card, a credit card, a prepaid card, an electronic ticket, electronic money, a telephone card, and a membership card.

Figure 17D:
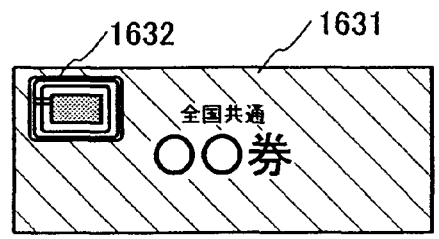

FIG. 17D shows an example of a state of a completed product of a bearer bond 1631. An RFID 1632 is embedded in the bearer bond 1631 and is protected by a resin formed in the periphery thereof. Here, the resin is filled with a filler. The bearer bond 1631 can be formed in the same manner as an ID label, an ID tag, and an ID card of the present invention. Note that the aforementioned bearer bonds include stamps, tickets, admission tickets, merchandise coupons, book coupons, stationery coupons, beer coupons, rice coupons, various gift coupons, various service coupons, and the like. Needless to say, they are not limited thereto. In addition, when the RFID 1632 of the present invention is provided in bills, coins, securities, bearer bonds, documents, or the like, an authentication function can be provided. By utilization of the authentication function, forgery can be prevented.

Figure 17E:
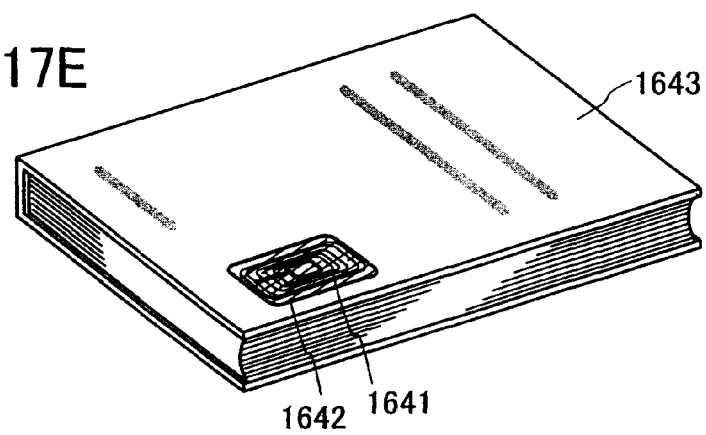

FIG. 17E shows a book 1643 to which an ID label 1641 including an RFID 1642 of the present invention is attached. The RFID 1642 of the present invention is fixed on objects by, for example, being attached to a surface or being embedded therein. As shown in FIG. 17E, the RFID 1642 can be embedded in paper of a book, or embedded in an organic resin of a package. Since the RFID 1642 of the present invention can reduced in size, thickness, and weight, it can be fixed on objects without spoiling the design thereof.

In addition, although not shown here, the efficiency of a system such as an inspection system can be improved by provision of the RFID of the present invention in, for example, packaging containers, storage media, personal belongings, foods, clothing, everyday articles, electronic appliances, or the like. Further, counterfeits and theft can be prevented by provision of the RFID on vehicles. Individual creatures such as animals can be easily identified by being implanted with the RFID. For example, year of birth, sex, breed, and the like can be easily identified by implantation of the RFID in creatures such as domestic animals.

Thus, the RFID of the present invention can be used by being provided in any object (including a creature).

Further, this embodiment mode can be implemented in combination with any of the other embodiment modes in this specification as appropriate.

This application is based on Japanese Patent Application serial no. 2006-295314 filed in Japan Patent Office on 31, Oct., 2006, the entire contents of which are hereby incorporated by reference.

What is claimed is:
1. A semiconductor device comprising:
a voltage controlled oscillator circuit having a first voltage terminal, a second voltage terminal and an output terminal configured to output a clock signal;
an antenna circuit configured to transmit and receive a signal;
a rectifier circuit configured to generate a power supply voltage between the first voltage terminal and the second voltage terminal from the signal;
a control circuit electrically connected between the first voltage terminal and the second voltage terminal, and configured so that a potential difference between the first voltage terminal and a control terminal of the control circuit remains constant;
a first transistor having:
  a first gate electrode electrically connected to an input terminal of the voltage controlled oscillator circuit;
  a first source region electrically connected to the second voltage terminal; and
  a first drain region electrically connected to the first gate electrode; and a second transistor having:
  a second gate electrode electrically connected to the control terminal of the control circuit;
  a second source region electrically connected to the first voltage terminal; and
  a second drain region electrically connected to the first drain region.

2. The semiconductor device according to claim 1, further comprising a capacitor electrically connected between the first gate electrode and the first source region.

3. The semiconductor device according to claim 1, wherein the first transistor and the second transistor are thin film transistors formed over a substrate having an insulating surface.

4. The semiconductor device according to claim 1, further comprising:
- a logic circuit configured to receive the clock signal and a data signal;
- a memory control circuit configured to receive the data signal from the logic circuit; and
- a memory circuit configured to be controlled by the memory control circuit.

5. A semiconductor device comprising:
- a voltage controlled oscillator circuit having an input voltage terminal, a reference voltage terminal and an output terminal configured to output a clock signal;
- an antenna circuit configured to transmit and receive a signal;
- a rectifier circuit configured to generate a power supply voltage between the input voltage terminal and the reference voltage terminal from the signal;
- a control circuit electrically connected between the input voltage terminal and the reference voltage terminal, and configured so that a potential difference between the input voltage terminal and a control terminal of the control circuit remains constant;
- an n-channel transistor having:
  - a first gate electrode electrically connected to an input terminal of the voltage controlled oscillator circuit;
  - a first source region electrically connected to the reference voltage terminal; and
  - a first drain region electrically connected to the first gate electrode; and
- a p-channel transistor having:
  - a second gate electrode electrically connected to the control terminal of the control circuit;
  - a second source region electrically connected to the input voltage terminal; and
  - a second drain region electrically connected to the first drain region.

6. The semiconductor device according to claim 5, further comprising a capacitor electrically connected between the first gate electrode and the first source region.

7. The semiconductor device according to claim 5, wherein the n-channel transistor and the p-channel transistor are thin film transistors formed over a substrate having an insulating surface.

8. The semiconductor device according to claim 5, further comprising:
- a logic circuit configured to receive the clock signal and a data signal;
- a memory control circuit configured to receive the data signal from the logic circuit; and
- a memory circuit configured to be controlled by the memory control circuit.

9. A semiconductor device comprising:
- a voltage controlled oscillator circuit having an input voltage terminal, a reference voltage terminal and an output terminal configured to output a clock signal;
- an antenna circuit configured to transmit and receive a signal;
- a rectifier circuit configured to generate a power supply voltage between the input voltage terminal and the reference voltage terminal from the signal;
- a control circuit electrically connected between the input voltage terminal and the reference voltage terminal, and configured so that a potential difference between the reference voltage terminal and a control terminal of the control circuit remains constant;
- a p-channel transistor having:
  - a first gate electrode electrically connected to an input terminal of the voltage controlled oscillator circuit;
  - a first source region electrically connected to the input voltage terminal; and
  - a first drain region electrically connected to the first gate electrode; and
- an n-channel transistor having:
  - a second gate electrode electrically connected to the control terminal of the control circuit;
  - a second source region electrically connected to the reference voltage terminal; and
  - a second drain region electrically connected to the first drain region.

10. The semiconductor device according to claim 9, further comprising a capacitor electrically connected between the first gate electrode and the first source region.

11. The semiconductor device according to claim 9, wherein the n-channel transistor and the p-channel transistor are thin film transistors formed over a substrate having an insulating surface.

12. The semiconductor device according to claim 9, further comprising:
- a logic circuit configured to receive the clock signal and a data signal;
- a memory control circuit configured to receive the data signal from the logic circuit; and
- a memory circuit configured to be controlled by the memory control circuit.

13. A semiconductor device comprising:
- a voltage controlled oscillator circuit having an input voltage terminal, a reference voltage terminal and an output terminal configured to output a clock signal;
- an antenna circuit configured to transmit and receive a signal;
- a rectifier circuit configured to generate a power supply voltage between the input voltage terminal and the reference voltage terminal from the signal; and
- a control circuit comprising:
  - a p-channel first control transistor having:
    - a first gate electrode electrically connected to a control terminal of the control circuit;
    - a first source region electrically connected to the input voltage terminal; and
    - a first drain region electrically connected to the control terminal of the control circuit;
  - a p-channel second control transistor having:
    - a second gate electrode electrically connected to the control terminal of the control circuit;
    - a second source region electrically connected to the input voltage terminal; and
    - a second drain region;
  - an n-channel third control transistor having:
    - a third gate electrode electrically connected to the second drain region;
    - a third source region; and
    - a third drain region electrically connected to the control terminal of the control circuit;
  - an n-channel fourth control transistor having:
    - a fourth gate electrode electrically connected to the third source region;

a fourth source region electrically connected to the reference voltage terminal; and
a fourth drain region electrically connected to the third gate electrode; and
a resistor electrically connected between the fourth gate electrode and the reference voltage terminal;
an n-channel fifth transistor having:
a fifth gate electrode electrically connected to an input terminal of the voltage controlled oscillator circuit;
a fifth source region electrically connected to the reference voltage terminal; and
a fifth drain region electrically connected to the fifth gate electrode; and
a p-channel sixth transistor having:
a sixth gate electrode electrically connected to the control terminal of the control circuit;
a sixth source region electrically connected to the input voltage terminal; and
a sixth drain region electrically connected to the fifth drain region.

14. The semiconductor device according to claim 13, further comprising a capacitor electrically connected between the fifth gate electrode and the fifth source region.

15. The semiconductor device according to claim 13, wherein the p-channel first control transistor, the p-channel second control transistor, the n-channel third control transistor, the n-channel fourth control transistor, the n-channel fifth transistor and the p-channel sixth transistor are thin film transistors formed over a substrate having an insulating surface.

16. The semiconductor device according to claim 13, further comprising:
a logic circuit configured to receive the clock signal and a data signal;
a memory control circuit configured to receive the data signal from the logic circuit; and
a memory circuit configured to be controlled by the memory control circuit.

17. A semiconductor device comprising:
a voltage controlled oscillator circuit having an input voltage terminal, a reference voltage terminal and an output terminal configured to output a clock signal;
an antenna circuit configured to transmit and receive a signal;
a rectifier circuit configured to generate a power supply voltage between the input voltage terminal and the reference voltage terminal from the signal; and
a control circuit comprising:
an n-channel first control transistor having:
a first gate electrode electrically connected to a control terminal of the control circuit;
a first source region electrically connected to the reference voltage terminal; and
a first drain region electrically connected to the control terminal of the control circuit;
an n-channel second control transistor having:
a second gate electrode electrically connected to the control terminal of the control circuit;
a second source region electrically connected to the reference voltage terminal; and
a second drain region;
a p-channel third control transistor having:
a third gate electrode electrically connected to the second drain region;
a third source region; and
a third drain region electrically connected to the control terminal of the control circuit;
a p-channel fourth control transistor having:
a fourth gate electrode electrically connected to the third source region;
a fourth source region electrically connected to the input voltage terminal; and
a fourth drain region electrically connected to the third gate electrode; and
a resistor electrically connected between the fourth gate electrode and the input voltage terminal;
a p-channel fifth transistor having:
a fifth gate electrode electrically connected to an input terminal of the voltage controlled oscillator circuit;
a fifth source region electrically connected to the input voltage terminal; and
a fifth drain region electrically connected to the fifth gate electrode; and
an n-channel sixth transistor having:
a sixth gate electrode electrically connected to the control terminal of the control circuit;
a sixth source region electrically connected to the reference voltage terminal; and
a sixth drain region electrically connected to the fifth drain region.

18. The semiconductor device according to claim 17, further comprising a capacitor electrically connected between the fifth gate electrode and the fifth source region.

19. The semiconductor device according to claim 17, wherein the n-channel first control transistor, the n-channel second control transistor, the p-channel third control transistor, the p-channel fourth control transistor, the p-channel fifth transistor and the n-channel sixth transistor are thin film transistors formed over a substrate having an insulating surface.

20. The semiconductor device according to claim 17, further comprising:
a logic circuit configured to receive the clock signal and a data signal;
a memory control circuit configured to receive the data signal from the logic circuit; and
a memory circuit configured to be controlled by the memory control circuit.

* * * * *